(12) United States Patent
Bang et al.

(10) Patent No.: US 10,763,315 B2
(45) Date of Patent: Sep. 1, 2020

(54) DISPLAY APPARATUS INCLUDING LIGHT RECEIVING PIXEL AREA

(71) Applicant: LG Display Co., Ltd., Seoul (KR)

(72) Inventors: Juyoung Bang, Daegu (KR); Hyung-Seok Bang, Daegu (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/586,682

(22) Filed: Sep. 27, 2019

(65) Prior Publication Data

US 2020/0105841 A1 Apr. 2, 2020

(30) Foreign Application Priority Data

Oct. 1, 2018 (KR) .................. 10-2018-0117126

(51) Int. Cl.
| | |
|---|---|
| H01L 27/32 | (2006.01) |
| H01L 51/52 | (2006.01) |
| H01L 27/146 | (2006.01) |
| G06K 9/00 | (2006.01) |
| H01L 31/105 | (2006.01) |
| H01L 31/0224 | (2006.01) |
| H01L 31/0203 | (2014.01) |
| H01L 31/173 | (2006.01) |
| H01L 31/12 | (2006.01) |

(52) U.S. Cl.
CPC ......... *H01L 27/323* (2013.01); *G06K 9/0004* (2013.01); *H01L 27/14623* (2013.01); *H01L 27/14678* (2013.01); *H01L 27/3246* (2013.01); *H01L 27/3262* (2013.01); *H01L 27/3272* (2013.01); *H01L 31/0203* (2013.01); *H01L 31/022408* (2013.01); *H01L 31/105* (2013.01); *H01L 31/125* (2013.01); *H01L 31/173* (2013.01); *H01L 51/5206* (2013.01); *H01L 51/5253* (2013.01)

(58) Field of Classification Search
CPC .................................................... H01L 27/323
USPC .......................................................... 257/40
See application file for complete search history.

(56) References Cited

U.S. PATENT DOCUMENTS

| | | | |
|---|---|---|---|
| 2017/0315293 A1* | 11/2017 | Bang ..................... | G02B 5/32 |
| 2018/0165533 A1* | 6/2018 | Cho ..................... | G02F 1/136 |
| 2019/0115411 A1* | 4/2019 | Park ..................... | G06F 3/0443 |

FOREIGN PATENT DOCUMENTS

KR    10-2017-0123578 A    11/2017

* cited by examiner

*Primary Examiner* — Ajay Arora
(74) *Attorney, Agent, or Firm* — Polsinelli PC

(57) ABSTRACT

A display apparatus including a plurality of display pixel areas and a plurality of light-receiving pixel areas which are arranged in a display area in which an image is displayed, comprises a thin-film transistor array including a plurality of thin-film transistors which correspond to the plurality of display pixel areas; a plurality of electro-luminescence devices disposed above the thin-film transistor array and corresponding to the plurality of display pixel areas; a plurality of light-receiving devices disposed above the thin-film transistor array and corresponding to the plurality of light-receiving pixel areas; a transparent film covering the plurality of electro-luminescence devices and the plurality of light-receiving devices; and a plurality of light shield patterns disposed on the transparent film and overlapping the plurality of light-receiving devices.

20 Claims, 15 Drawing Sheets

DISPLAY APPARATUS INCLUDING LIGHT RECEIVING PIXEL AREA

CROSS REFERENCE TO RELATED APPLICATION

This application claims priority to and the benefit of Korean Patent Application No. 10-2018-0117126 filed on Oct. 1, 2018, which is hereby incorporated by reference in its entirety.

BACKGROUND

Field of the Disclosure

The present disclosure relates to a display apparatus, and more particularly, to a display apparatus including a light-receiving pixel area for sensing a touch and/or a fingerprint. Although the present disclosure is suitable for a wide scope of applications, it is particularly suitable for improving a signal-to-noise ratio of the display apparatus that has an in-cell type light-receiving device.

Description of the Background

A display apparatus may be applied to a variety of electronic devices such as a TV set, a mobile phone, a laptop, a tablet and the like. Accordingly, research into a thin display apparatus, a lightweight display apparatus, a display apparatus which consumes less electricity and the like has been underway.

Display apparatuses may be classified into a liquid crystal display (LCD) apparatus, a plasma display panel (PDP) apparatus, a field emission display (FED) apparatus, an electro-wetting display (EWD) apparatus, an electro-luminescence display device (ELDD) and the like.

In general, display apparatuses include display panels (hereinafter referred to as "display panel" or "panel") which emit light for displaying images. Usual display panels include a pair of substrates which face each other, and a light-emitting material or a liquid crystal material which is disposed between the pair of substrates.

The display apparatuses may comprise a sensor for sensing a touch such that a user convenience can be enhanced and the display apparatuses can be applied to a wider range of products. By doing so, the sensor may sense a location of a touch which is input onto a display surface, and input may be performed. Accordingly, the display apparatuses including touching sensor can be substituted for an additional input device such as a mouse, a keyboard and the like.

Types of comprising sensors for sensing a touch may involve an add-on type, an on-cell type, an in-cell type and the like. In the add-on type, a touch sensing panel which includes sensors for sensing a touch arranged in a matrix form is additionally prepared, and the additional touch sensing panel is disposed above or below a display panel. In the on-cell type, sensors for sensing a touch are disposed above a light-emitting material or a liquid crystal material between a pair of substrates of a display panel. In the in-cell type, a thin-film transistor array for driving a plurality of display pixel areas and sensors for sensing a touch are integrated above a substrate. Unlike the add-on type and on-cell type panels, the in-cell type panel may have a minimized thickness.

Methods for sensing a touch may include a method for sensing a location at which resistance is varied (hereinafter referred to as "resistance method"), a method for sensing a location at which electrostatic capacity is varied (hereinafter referred to as "electrostatic capacity method"), a method for sensing a location at which an amount of light is varied (hereinafter referred to as "optical method", and the like.

In the optical method, a difference in reflectance of light corresponding to a difference in a refractive index of each location of a medium which contacts a surface of a panel is sensed to sense touches or patterns of fingerprints. For instance, in an area not touched by skin, internal light is reflected at high reflectance and input to a light-receiving device corresponding to the area. In an area contacted by skin, a large amount of the internal light is transmitted or absorbed, and only a small amount of the internal light is input to a light-receiving device corresponding to the area contacted by skin. In this case, a difference in amounts of light is sensed to recognize a pattern of a finger print, or a touch.

In the optical method, signal light generated in a panel as well as noise light from the outside of a panel may be input to the light-receiving device. In this case, there is a need for a method of improving a signal-to-noise ratio by increasing a ratio of signal light to noise light.

The above information disclosed in this Background section is only for enhancement of understanding of the background of the described technology and therefore it may contain information that does not form prior art that is already known in this country to a person of ordinary skill in the art.

SUMMARY

Accordingly, the present disclosure is directed to a display apparatus including a light-receiving pixel area that substantially obviates one or more of problems due to limitations and disadvantages of the prior art.

Additional features and advantages of the disclosure will be set forth in the description which follows and in part will be apparent from the description, or may be learned by practice of the disclosure. Other advantages of the present disclosure will be realized and attained by the structure particularly pointed out in the written description and claims hereof as well as the appended drawings.

More specifically, the present disclosure provides a display apparatus including an in-cell type light-receiving device, which can enhance a signal-to-noise ratio.

According to an aspect of the present disclosure, a display apparatus including a plurality of display pixel areas and a plurality of light-receiving pixel areas which are arranged in a display area in which an image is displayed includes a thin-film transistor array including a plurality of thin-film transistors which correspond to the plurality of display pixel areas, a plurality of electro-luminescence devices disposed above the thin-film transistor array and corresponding to the plurality of display pixel areas, a plurality of light-receiving devices disposed above the thin-film transistor array and corresponding to the plurality of light-receiving pixel areas, and a plurality of light shield patterns disposed above a transparent film which covers the plurality of electro-luminescence devices and the plurality of light-receiving devices and overlapped with the plurality of light-receiving devices.

Each of the light shield patterns has a width greater than that of each of the light-receiving devices. That is, an edge of each light shield pattern protrudes further than an edge of each light-receiving device.

The display apparatus further includes a transparent cover member covering the light shield pattern.

A display apparatus according to the present disclosure includes a plurality of light-receiving devices which are disposed above a thin-film transistor array together with a plurality of electro-luminescence devices, and a plurality of light shield patterns disposed above a transparent film which covers the plurality of light-receiving devices and overlapped with the plurality of light-receiving devices. Each of the light shield patterns has a width greater than that of each of the light-receiving devices.

Input of noise light outside and/or inside the device to the light-receiving device may be minimized by each light shield pattern overlapped with each light-receiving device. The noise light is referred to as the rest light except for signal light required for sensing a touch and/or a fingerprint, among internal light which is generated in a panel and external light which is input from the outside of the panel.

Input of noise light to the light-receiving device may be minimized by the light shield pattern. Accordingly, optical noise may be reduced in implementing the functions of sensing a fingerprint and/or sensing a touch and the like.

Additionally, a shape and size of an available sensing area corresponding to geometric structures of the light shield pattern, the light-receiving device and the transparent cover member may be properly set. Accordingly, accuracy of obtaining a pattern of an object subject to sensing such as a pattern of a fingerprint, an area touched by a finger, and the like may improve.

Further, in a structure in which a plurality of light-receiving devices and a plurality of electro-luminescence devices are disposed on the same substrate, i.e., a structure in which light-receiving devices are provided in an in-cell type, an additional sensor module may be removed. As a result, the display apparatus may have a simple structure.

BRIEF DESCRIPTION OF THE DRAWINGS

The accompanying drawings, which are included to provide a further understanding of the disclosure and are incorporated in and constitute a part of the disclosure, illustrate aspects of the disclosure and together with the description serve to explain the principle of the disclosure.

In the drawings.

DETAILED DESCRIPTION

Figure 1:
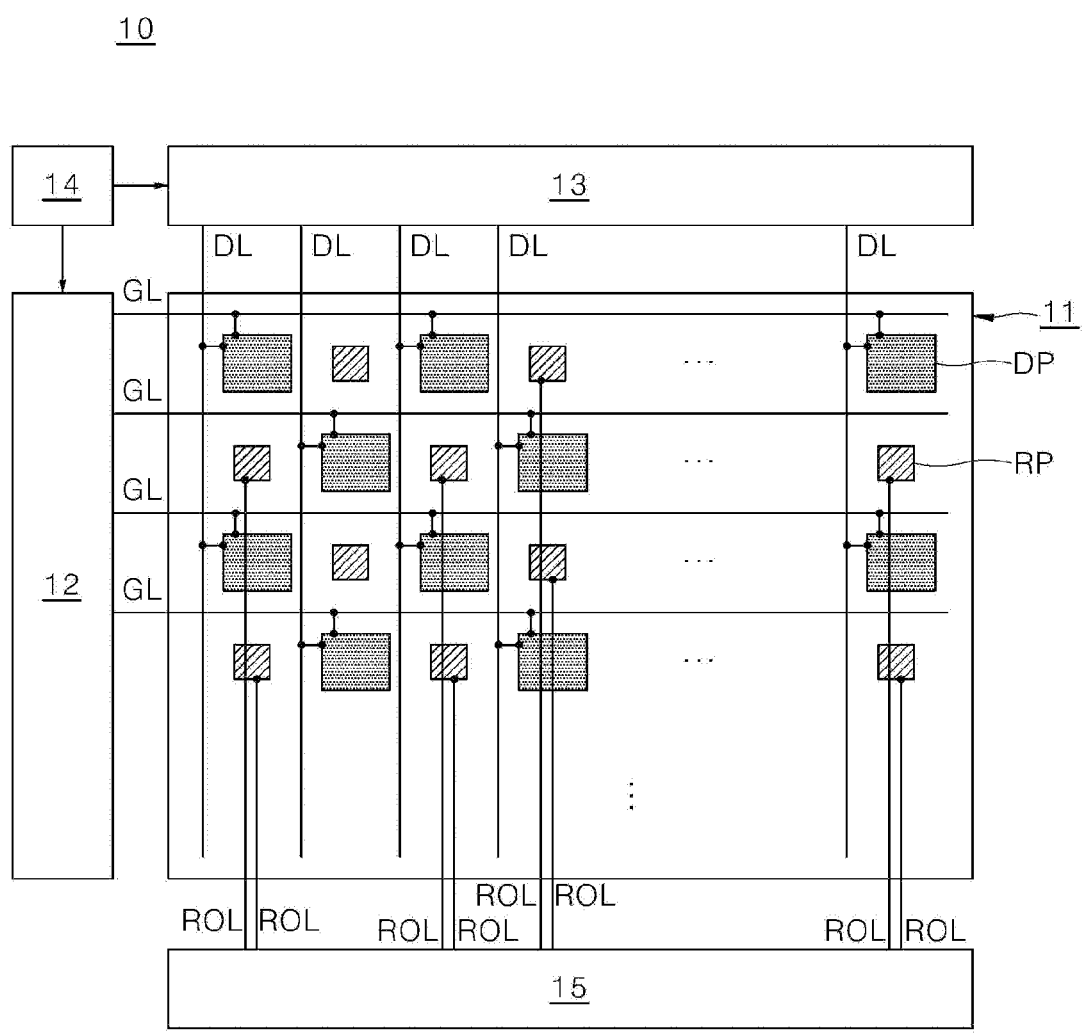
FIG. 1 is a view illustrating a display apparatus according to a first aspect of the present disclosure.

The above-described features and advantages are specifically described hereunder with reference to the attached drawings. Accordingly, one having ordinary skill in the art may readily implement the technical spirit of the present disclosure. Further, in describing the present disclosure, publicly-known technologies in relation to the disclosure are not specifically described if they are deemed to make the gist of the disclosure unnecessarily vague. Below, aspects are described with reference to the attached drawings. In the drawings, like reference numerals denote like or similar elements.

Below, a display apparatus according to each aspect is described with reference to the attached drawings.

With reference to FIGS. 1 to 6, a display apparatus according to a first aspect of the present disclosure is described.

Figure 2:
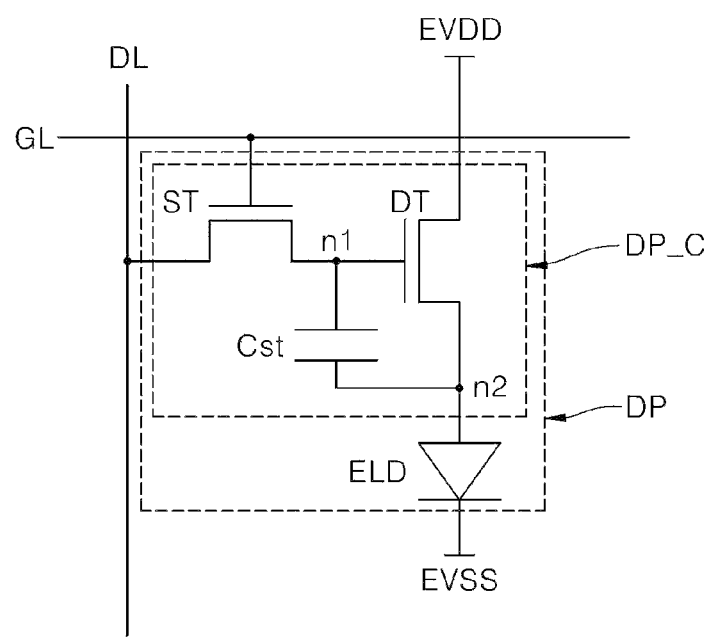
FIG. 2 is a view illustrating an example of an equivalent circuit which corresponds to the display pixel area in FIG. 1.
Figure 3:
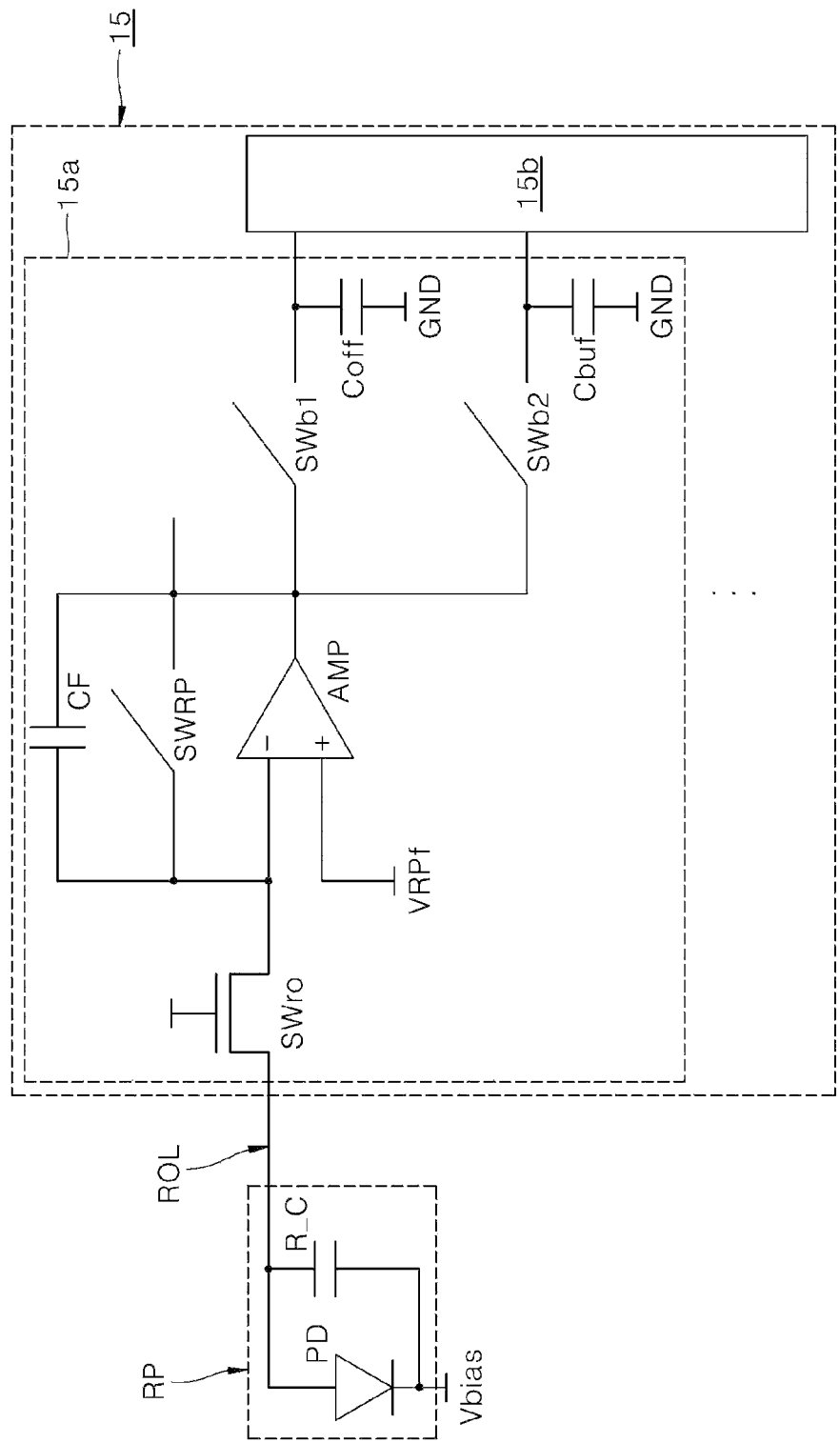
FIG. 3 is a view illustrating an example of an equivalent circuit which corresponds to a portion of the light-receiving pixel area and the readout driving unit in FIG. 1.

FIG. 1 is a view illustrating a display apparatus according to a first aspect of the present disclosure, FIG. 2 is a view illustrating an example of an equivalent circuit which corresponds to the display pixel area in FIG. 1, and FIG. 3 is a view illustrating an example of an equivalent circuit which corresponds to a portion of the light-receiving pixel area and the readout driving unit in FIG. 1.

Figure 4:
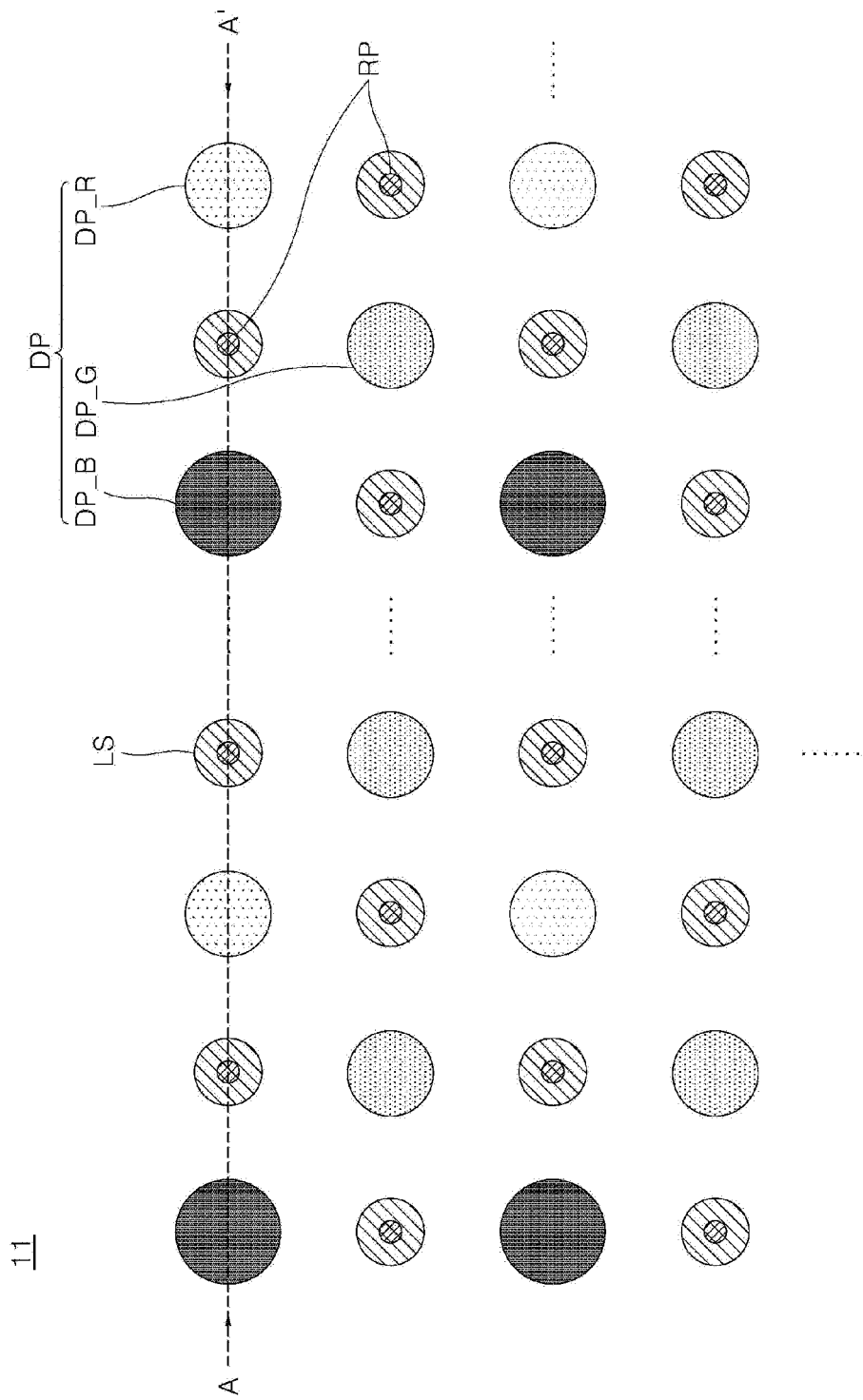
FIG. 4 is a view illustrating a state in which a plurality of display pixel areas and a plurality of light-receiving pixel areas are arranged in the display area in FIG. 1.
Figure 5:
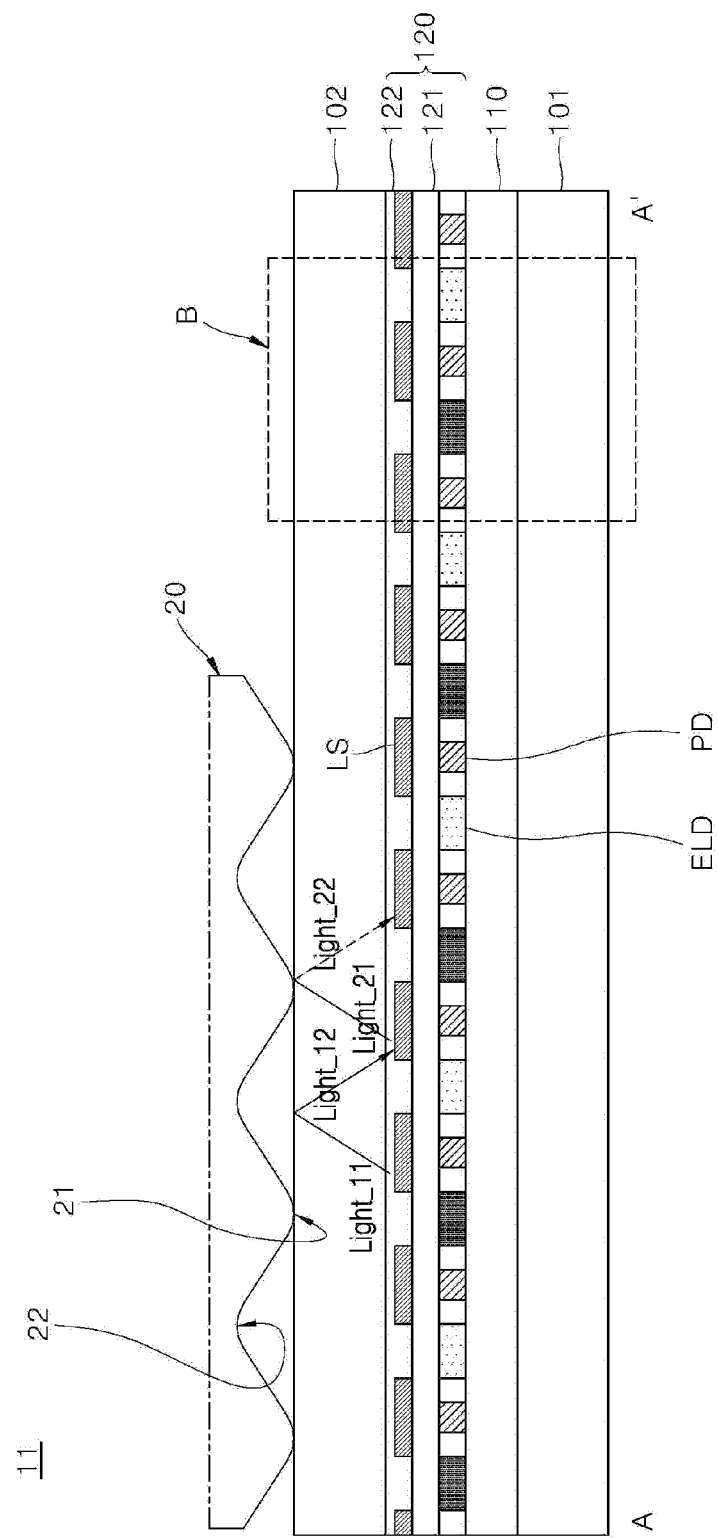
FIG. 5 is a view illustrating an example of a cross section of a display panel, which corresponds to area A-A' in FIG. 4.
Figure 6:
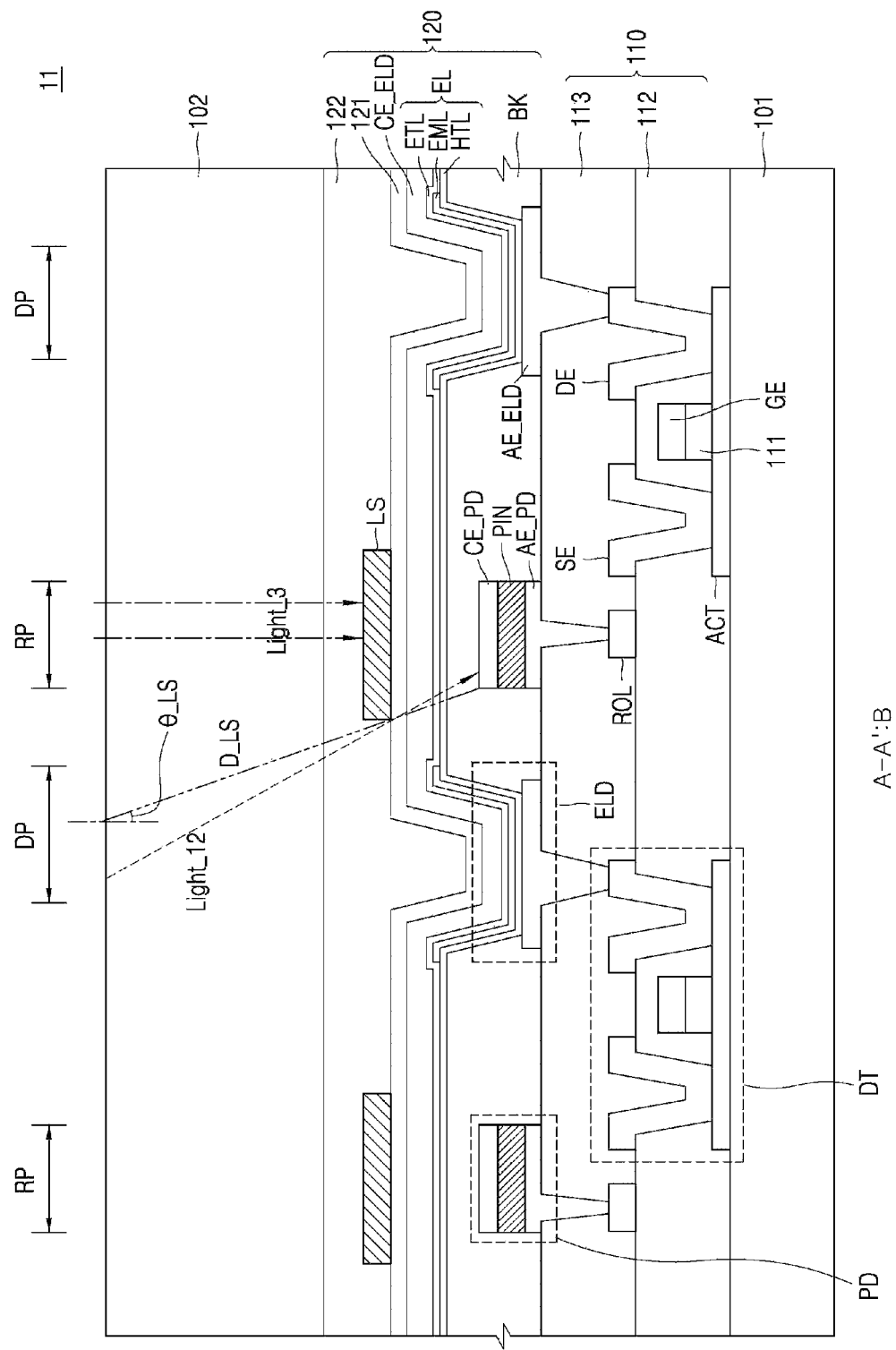
FIG. 6 is a view illustrating area B in FIG. 5.

FIG. 4 is a view illustrating a state in which a plurality of display pixel areas and a plurality of light-receiving pixel areas are arranged in the display area in FIG. 1, FIG. 5 is a view illustrating an example of a cross section of a display panel, which corresponds to area A-A' in FIG. 4, and FIG. 6 is a view illustrating area B in FIG. 5.

As illustrated in FIG. 1, a display apparatus 10 according to a first aspect of the present disclosure includes a display panel 11 which includes a display area in which an image is displayed, and a panel driving unit (12, 13, 14, and 15) which drives the display panel 11.

The display panel 11 includes a light-emitting material or a liquid crystal material which is disposed above a substrate. A display area of the display panel 11 includes a plurality of display pixel areas DP which are configured to display an image, and a thin-film transistor array which drives the plurality of display pixel areas DP. The thin-film transistor array includes a plurality of thin-film transistors which correspond to the plurality of display pixel areas DP, and various signal lines.

Additionally, a plurality of display pixel areas DP, and a plurality of light-receiving pixel areas RP for sensing shapes of finger prints or locations of touches in an optical manner are disposed in the display area of the display panel 11.

Accordingly, the plurality of display pixel areas DP and the plurality of light-receiving pixel areas RP are arranged in the display area of the display panel 11.

The display panel 11 may include a plurality of electro-luminescence devices (ELD shown in FIG. 2) which correspond to the plurality of display pixel areas DP, and a plurality of light-receiving devices (PD shown in FIG. 3) which correspond to the plurality of light-receiving pixel areas RP.

The plurality of electro-luminescence devices ELD and the plurality of light-receiving devices PD are disposed above the thin-film transistor array (110 shown in FIG. 5).

The thin-film transistor array 110 of the display panel 11 includes gate lines GL and data lines DL which connect to the plurality of display pixel areas DP, and readout lines ROL which connect to the plurality of light-receiving pixel areas RP.

For example, each gate line GL may correspond to each horizontal line which includes display pixel areas horizontally arranged in a sequence among the plurality of display pixel areas DP. Each data line DL may correspond to each perpendicular line which includes display pixel areas perpendicularly arranged in a sequence among the plurality of display pixel areas DP. Each readout line ROL may correspond to each light-receiving pixel area RP. However, this is only an example. Types and arrangements of signal lines such as gate lines GL, data lines DL and readout lines ROL may vary depending on a driving method of the plurality of display pixel areas DP and a driving method of the plurality of light-receiving pixel areas RP.

The panel driving unit (12, 13, 14, and 15) may include a gate driving unit 12 which drives the gate line GL, a data driving unit 13 which drives the data line DL, a timing controller 14 which controls timing of driving the gate driving unit 12 and the data driving unit 13, and a readout driving unit 15 which drives the readout line ROL.

For instance, the gate driving unit 12 consecutively supplies gate signals to the gate line GL based on gate driving initiation signals and gate clock signals of the timing controller 14. In this case, a switching thin-film transistor (ST shown in FIG. 2) of the display pixel area DP is turned on based on the gate signals.

The data driving unit 13 supplies data signals of each display pixel area DP to each data line DL based on data driving initiation signals and data clock signals of the timing controller 14.

The readout driving unit 15 performs readout of detection signals corresponding to each light-receiving pixel area RP.

As illustrated in FIG. 2, each display pixel area DP includes an electro-luminescence device ELD, and a pixel circuit (DP_C; a drive circuit part of a display pixel) for supplying driving current to the electro-luminescence device ELD.

The pixel circuit DP_C includes a driving transistor DT which is disposed in series with the electro-luminescence device ELD between a first driving power supply line EVDD and a second driving power supply line EVSS, a switching transistor ST which is disposed between the driving transistor DT and the data line DL, and a storage capacitor Cst which is disposed between a first node n1 and a second node n2. The first node n1 is disposed between a gate electrode of the driving transistor DT and the switching transistor ST, and the second node n2 is disposed between the driving transistor DT and the electro-luminescence device ELD.

In the pixel circuit DP_C, when the switching transistor ST is turned on, based on gate signals of the gate line GL, the switching transistor ST delivers data signals of the data line DL to the first node n1. The storage capacitor Cst is charged based on the data signals. In this case, the driving transistor DT is turned on, based on charging voltage of the storage capacitor Cst, and driving current generated by the turned-on driving transistor DT is supplied to the electro-luminescence device ELD.

However, this is only an example. The pixel circuit DP_C may have a structure in which a compensating circuit which compensates a threshold voltage deviation ($\Delta Vth$) of the driving transistor DT and the like are further included.

However, this is only an example. The pixel circuit DP_C may be implemented as at least one of a NMOS transistor, a PMOS transistor and/or a CMOS transistor.

As illustrated in FIG. 3, each light-receiving pixel area RP includes a light-receiving device such as a pin diode PD. Additionally, each light-receiving pixel area RP may further include a light-receiving capacitor R_C which connects in parallel to the light-receiving device PD. The light-receiving capacitor R_C may be a parasitic capacitor of the light-receiving device PD.

The light-receiving device PD connects between a bias power supply line Vbias and the readout line ROL. For example, when incident light is input to the light-receiving device PD, electron-hole pairs are generated in a P-I-N junction of the light-receiving device in response to the incident light. In this case, electrons of the electron-hole pairs move on the basis of bias power supply Vbias. Accordingly, detection signals which correspond to an amount of light input to the light-receiving device PD are generated.

The readout driving unit 15 includes a data detecting unit 15*a* which corresponds to each readout line ROL, and a detected-image-signal generating unit 15*b* which generates a detected image signal on the basis of output of the data detecting unit 15*a*.

The data detecting unit 15*a* includes an amplifier AMP that corresponds to each readout line ROL, a readout switch SWro which is disposed between the readout line ROL and the amplifier AMP, a feedback capacitor CF and a feedback reset switch SWRP which correspond to the amplifier AMP, an offset capacitor Coff and a buffer capacitor (Cbuf; a detection signal capacitor) which correspond to an output terminal of the amplifier AMP, a $1^{st}$ buffer switch SWb1 which is disposed between the amplifier AMP and the offset capacitor Coff, and a $2^{nd}$ buffer switch SWb2 which is disposed between the amplifier AMP and the buffer capacitor Cbuf.

A first input terminal (−) of the amplifier AMP connects with the readout line ROL through the readout switch SWro. Accordingly, when the readout switch SWro is turned on, detection signals which correspond to each light-receiving pixel area RP are input to the first input terminal (−) of the amplifier AMP through the readout line ROL.

Predetermined reference signals VRPf are input to a second input terminal (+) of the amplifier AMP.

The feedback capacitor CF is disposed between the first input terminal (−) and the output terminal of the amplifier AMP. Accordingly, gain between the first input terminal (−) and the output terminal of the amplifier AMP corresponds to capacitance of the feedback capacitor CF.

The feedback reset switch SWRP is disposed in parallel with the feedback capacitor CF between the first input terminal (−) and the output terminal of the amplifier AMP. The feedback reset switch SWRP is to detect offset signals which correspond to noise of the amplifier AMP.

When the feedback reset switch SWRP and the $1^{st}$ buffer switch SWb1 are turned on in the state in which the readout switch SWro is turned off, the offset capacitor Coff is charged based on offset signals which correspond to noise of the amplifier AMP. This operation in which the offset capacitor Coff is charged based on the offset signal may be performed during a period for initialization which is carried out before each of the sensing periods in the data detecting unit 15a corresponding to the entire readout line ROL.

When the readout switch SWro is turned on, detection signals of each light-receiving pixel area RP are input to the first input terminal (−) of the amplifier AMP, and amplified detection signals are output from the output terminal of the amplifier AMP. Additionally, when the $2^{nd}$ buffer switch SWb2 is turned on, the buffer capacitor Cbuf is charged based on the amplified detection signals.

The detected-image-signal generating unit 15b connects to the offset capacitor Coff and the buffer capacitor Cbuf, and generates detected image signals on the basis of offset signals and amplified detection signals which are output from each data detecting unit 15a. For instance, the detected-image-signal generating unit 15b may generate a brightness level signal which corresponds to an amount of light input to each light-receiving pixel area RP on the basis of offset signals and amplified detection signals output from each data detecting unit 15a, and may generate detected image signals based on a combination of a plurality of brightness level signals which correspond to the plurality of light-receiving pixel areas RP.

However, the data detecting unit 15a is an exemplary circuit diagram, and the present disclosure is not limited to this. Further, a few aspects of the present disclosure may include data detecting units which are modified in different forms to perform substantially the same functions.

As illustrated in FIG. 4, a display panel 11 includes a plurality of display pixel areas DP and a plurality of light-receiving pixel areas RP which are arranged in a matrix form in a display area in which an image is displayed. Additionally, the display panel 11 further includes a plurality of light shield patterns LS which correspond to the plurality of light-receiving pixel areas RP.

The plurality of display pixel areas DP may include a red display pixel area DP_R in which red light is emitted, a green display pixel area (DP _G in which green light is emitted, and a blue display pixel area DP _B in which blue light is emitted.

In this case, an electro-luminescence device (ELD shown in FIG. 2) which corresponds to each display pixel area DP may be a device which emits any one of a red color, a green color and a blue color.

That is, an electro-luminescence layer of an electro-luminescence device (ELD in FIG. 2) which corresponds to the red display pixel area DP_R may include a dopant or a host which corresponds to a red color.

Likewise, an electro-luminescence layer of an electro-luminescence device (ELD in FIG. 2) which corresponds to the green display pixel area DP_G may include a dopant or a host which corresponds to a green color.

Additionally, an electro-luminescence layer of an electro-luminescence device (ELD in FIG. 2) which corresponds to the blue display pixel area DP_B may include a dopant or a host which corresponds to a blue color.

A plurality of electro-luminescence devices (ELD in FIG. 2) which correspond to the plurality of display pixel areas DP may be a device which emits white light. In this case, the display panel 11 may further include a color filter which corresponds to each display pixel area DP.

That is, the display panel 11 may further include a red color filter which corresponds to the red display pixel area DP_R, a green color filter which corresponds to the green display pixel area DP_G, and a blue color filter which corresponds to the blue display pixel area DP_B.

Each light-receiving pixel area RP is disposed between two adjacent display pixel areas DP.

Additionally, the plurality of light-receiving pixel areas RP are disposed to alternate with at least one display pixel area DP which is arranged in a sequence in a specific direction among the plurality of display pixel areas DP. That is, at least one display pixel area DP and one light-receiving pixel area RP may be alternately disposed in any one of a horizontal direction, a perpendicular direction and a diagonal direction.

As an example, as illustrated in FIG. 4, one display pixel area DP and one light-receiving pixel area RP may be alternately disposed in a horizontal direction and a perpendicular direction.

However, this is only an example. Each light-receiving pixel area RP may be disposed between one or more display pixel areas DP horizontally, perpendicularly and diagonally, or one display pixel area DP and one light-receiving pixel area RP may be alternately disposed in a diagonal direction.

A gap in which the light-receiving pixel areas RP are arranged may be adjusted on the basis of an object subject to sensing. For example, a gap in which the light-receiving pixel areas RP are arranged may be less than that between ridges of a fingerprint to implement the function of sensing a fingerprint. As an example, an accurate and fine degree of the light-receiving pixel area RP may be 300 dpi (dots per inch) or more, and particularly, may be 400 dpi or more.

Referring to FIG. 5, a display panel 11 includes a substrate 101, a thin-film transistor array 110 which is disposed above the substrate 101, a device array120 which disposed above the thin-film transistor array 110, a plurality of light shield patterns LS, and a transparent cover member 102.

The thin-film transistor array 110 includes a plurality of thin-film transistors (ST and DT shown in FIG. 2) which correspond to a plurality of display pixel areas (DP shown in FIG. 1).

When a plurality of light-receiving pixel areas (RP shown in FIG. 1) are driven in an active matrix manner, the thin-film transistor array 110 may further include a plurality of thin-film transistors (invisible) which correspond to the plurality of light-receiving pixel areas RP. That is, the thin-film transistor array 110 may further include a signal line which drives the plurality of light-receiving pixel areas RP and a thin-film transistor.

The device array120 includes a plurality of electro-luminescence devices ELD which correspond to the plurality of display pixel areas (DP shown in FIG. 1), and a plurality of light-receiving devices PD which correspond to the plurality of light-receiving pixel areas (RP shown in FIG. 1).

A transparent film 121 is disposed above the plurality of electro-luminescence devices ELD and the plurality of light-receiving devices PD.

A plurality of light shield patterns LS are disposed above the transparent film 121. The plurality of light shield patterns LS are disposed to cover the plurality of light-receiving devices PD and overlap the plurality of light-receiving devices PD. A transparent cover member 102 is disposed above the plurality of light shield patterns LS. The transparent cover member 102 may include a material such as glass, reinforced glass, reinforced plastics and the like that may protect the display panel 11.

A protective film 122 may be further disposed between the plurality of light shield patterns LS and the transparent cover member 102. However, the present disclosure is not limited to what has been described.

Light that is emitted from an electro-luminescence device ELD may pass through the transparent cover member 102 and may be emitted outward through an upper surface of the transparent cover member 102.

At least portion Light_12 of light Light_11 in the transparent cover member 102 reflects toward the light-receiving device PD in an interface between the upper surface of the transparent cover member 102 and air. An amount of the light Light_12 which reflects toward the light-receiving device PD in each position of the upper surface of the transparent cover member 102, as described above, is determined on the basis of a refractive index of a medium (e.g., air, skin and the like) which contacts the upper surface of the transparent cover member 102. In other words, an amount of light Light_12 which reflects toward the inside of the panel may differ in a corresponding area depending on whether the area in the panel is touched by a finger. Additionally, among the light Light_12 which reflects toward the light-receiving device PD, light which has an incidence angle more than or equal to a critical angle of total internal reflection which corresponds to a refractive index of a medium (e.g., air, skin and the like) contacting the upper surface of the transparent cover member 102 and which corresponds to a refractive index of the transparent cover member 102 totally reflects from the upper surface of the transparent cover member 102.

Prints of a finger 20 consist of ridges which have specific patterns. Accordingly, ridge parts 21 of a finger 20 contact the upper surface of the transparent cover member 102, but spaced parts 22 between the ridges do not contact the transparent cover member 102, in the state in which the finger 20 contacts the upper surface of the transparent cover member 102. That is, in the ridge parts 21, the upper surface of the transparent cover member 102 contacts skin, but in the spaced parts 22 between the ridges, the upper surface of the transparent cover member 102 contacts air.

In this case, the skin has a different refractive index from air. Accordingly, an amount of light Light_22 which reflects in an area of the upper surface of the transparent cover member 102, which contacts the ridge parts 21, is different from an amount of light Light_12 which reflects in an area of the upper surface of the transparent cover member 102, which contacts the spaced parts 22 between the ridges. Additionally, most of the light passes through the skin or is absorbed in the skin in the area which contacts the ridge parts 21, and the rest of the light may reflect. Thus, the ridge parts 21 of the finger print 20 and the spaced parts 22 between the ridges may be drawn on the basis of a difference in amounts of light (Light_12, and Light_22) which is input to the light-receiving device PD.

As illustrated in FIG. 6, a display panel 11 includes a thin-film transistor array 110 which is disposed above a substrate 101, a plurality of electro-luminescence devices ELD which are disposed above the thin-film transistor array 110 and which correspond to a plurality of display pixel areas DP, a plurality of light-receiving devices PD which are disposed above the thin-film transistor array 110 and which correspond to a plurality of light-receiving pixel areas RP, and a plurality of light shield patterns LS which are disposed above a transparent film 121 covering the plurality of electro-luminescence devices ELD and the plurality of light-receiving devices PD and which are overlapped with the plurality of light-receiving devices PD.

Width of each of the light shield patterns LS is greater than that of each of the light-receiving devices PD. That is, an edge of each of the light shield patterns LS protrudes further than an edge of each of the light-receiving devices PD. Accordingly, each light-receiving device PD is configured to sense light which is input through an area which is not shielded by each light shield pattern LS, i.e., a perimeter of each light shield pattern LS.

When necessary, the edge of each light shield pattern LS sufficiently protrudes relative to the edge of each light-receiving device PD in all directions. Thus, among light which is input from the outside of the panel (hereinafter referred to as "external light") and light which is generated in the panel by the plurality of electro-luminescence devices ELD and the like (herein after referred to as "internal light"), light which reflects from the upper surface of the transparent cover member 102, i.e., from an area corresponding to the light shield pattern LS, reaches the light-receiving device PD to a minimum degree.

A collection of points at which extension lines which connect an edge of each light shield pattern LS and an edge of each light-receiving device PD meet the upper surface of the transparent cover member 102 draws a closed curve. In this case, an inner area of a closed curve with a largest possible surface area is referred to as a light shield area. The light shield area may have a proper size and shape in response to a size and shape of a pattern subject to sensing. For instance, the light shield area for sensing a fingerprint and a touch may have a proper size and shape on the basis of a distance and size of each pattern subject to sensing.

As an example, the light shield area which corresponds to each light-receiving device PD and each light shield pattern LS may correspond to a distance between the light shield pattern LS and the upper surface of the transparent cover member 102, a distance between the light shield pattern LS and the light-receiving device PD, a width of the light shield pattern LS, and a width of the light-receiving device PD.

Among the lines which connect the edge of each light shield pattern LS and the edge of each light-receiving device PD, a line which forms a minimum angle together with a normal line of the upper surface of the transparent cover member 102 is referred to as a light-shield-pattern available minimum incidence path D_LS. An angle θ_LS (hereinafter referred to as "a light-shield-pattern minimum available incidence angle") which is formed by the light-shield-pattern available minimum incidence path D_LS and the normal line of the upper surface of the transparent cover member 102 is greater than a predetermined critical angle. The predetermined critical angle corresponds to the transparent cover member 102, and a medium which contacts the upper surface of the transparent cover member 102. For instance, a critical angle with respect to the light-shield-pattern minimum available incidence angle may be determined on the basis of a range of incidence angels which are selected as noise light or a range of incidence angels which is selected as signal light.

By doing so, the light shield pattern LS may minimize input of external light to the light-receiving device PD, thereby improving a signal-to-noise ratio in relation to external light. When the light-shield-pattern minimum available incidence angle becomes smaller, input of noise light which is unnecessary for sensing a touch and/or a fingerprint, among inner light, to the light-receiving device may be further reduced, and a signal-to-noise ratio in relation to noise light may be further increased.

In other words, among lines which connect an edge of the light shield pattern LS and an edge of the light-receiving device PD, a line which forms a minimum angle together with a normal line of an upper surface of the transparent cover member 102 is referred to as a light-shield-pattern available minimum incidence path D_LS. When necessary, an angle θ_LS (hereinafter referred to as "light-shield-pattern minimum available incidence angle") which is formed by the light-shield-pattern available minimum incidence path D_LS and the normal line of the upper surface of the transparent cover member 102 may be greater than a predetermined critical angle. The predetermined critical angle corresponds to the transparent cover member, and a medium which contacts the upper surface of the transparent cover member.

For instance, when the light-shield-pattern minimum available incidence angle θ_LS is set to the same angle as a critical angle, input of reflected light of an angle less than or equal to an incidence angle in the panel as well as external light to the light-receiving device PD may be minimized. When the light-shield-pattern minimum available incidence angle θ_LS extends further than a critical angle, input of unnecessary light of total internal reflection, which proceeds in the panel, to the light-receiving device PD may also be minimized, thereby improving a signal-to-noise ratio in relation to external light as well as internal noise light.

The thin-film transistor array 110 includes a driving transistor DT which connects to the electro-luminescence device ELD corresponding to each display pixel area (DP shown in FIG. 1).

For instance, the driving transistor DT may have a top gate structure. That is, the driving transistor DT includes an active layer ACT which is disposed above the substrate 101, a gate insulating film 111 which is disposed above a portion of the active layer ACT, a gate electrode GE which is disposed above the gate insulating film 111, and a source electrode SE and a drain electrode DE which are disposed above an interlayer insulating film 112 covering the active layer ACT and the gate electrode GE.

The gate electrode GE connects to a switching transistor (ST shown in FIG. 2) and a storage capacitor (Cst shown in FIG. 2) through a first node (n1 shown in FIG. 2).

The active layer ACT includes a channel area which is overlapped with the gate electrode GE, and a source area and a drain area which are disposed on both sides of the channel area. The active layer ACT may consist of an oxide semi-conductor material or a silicon semiconductor material.

The source electrode SE connects to the source area of the active layer ACT through a contact hole which penetrates the interlayer insulating film112.

Like the source electrode SE, the drain electrode DE connects to the drain area of the active layer ACT through a contact hole which penetrates the interlayer insulating film 112.

Any one (source electrode SE shown in FIG. 6) of the source electrode SE and the drain electrode DE of the driving transistor DT connects to a first driving power supply line (EVDD shown in FIG. 2), and the other (drain electrode DE shown in FIG. 6) connects to the electro-luminescence device ELD.

The source electrode SE and the drain electrode DE of the driving transistor DT are covered with a buffer film 113.

The electro-luminescence device ELD includes an anode electrode AE_ELD which is disposed above the buffer film 113 of the thin-film transistor array 110, an electro-luminescence layer EL which is disposed above the anode electrode AE_ELD, and a cathode electrode CE_ELD which is disposed above the electro-luminescence layer EL.

The anode electrode AE_ELD corresponds to each display pixel area DP and connects to the driving transistor DT through the contact hole which penetrates the buffer film 113.

An edge of the anode electrode AE_ELD is covered with a bank BK which is disposed above the buffer film 113 of the thin-film transistor array 110.

The bank BK may consist of a light-absorbing or light-transmitting insulation material to prevent carriers from being clustered on the edge of the anode electrode AE_ELD.

The electro-luminescence layer EL corresponds to each display pixel area DP and includes an electro-luminescence material. The electro-luminescence material may be an organic material, or an inorganic material. When a diode is made of an organic material, the diode may be referred to as an organic light-emitting diode (OLED). When a diode is made of an inorganic material, the diode may be a quantum-dot light-emitting diode (QLED). However, the electro-luminescence material is not limited to what has been described.

Figure 12:
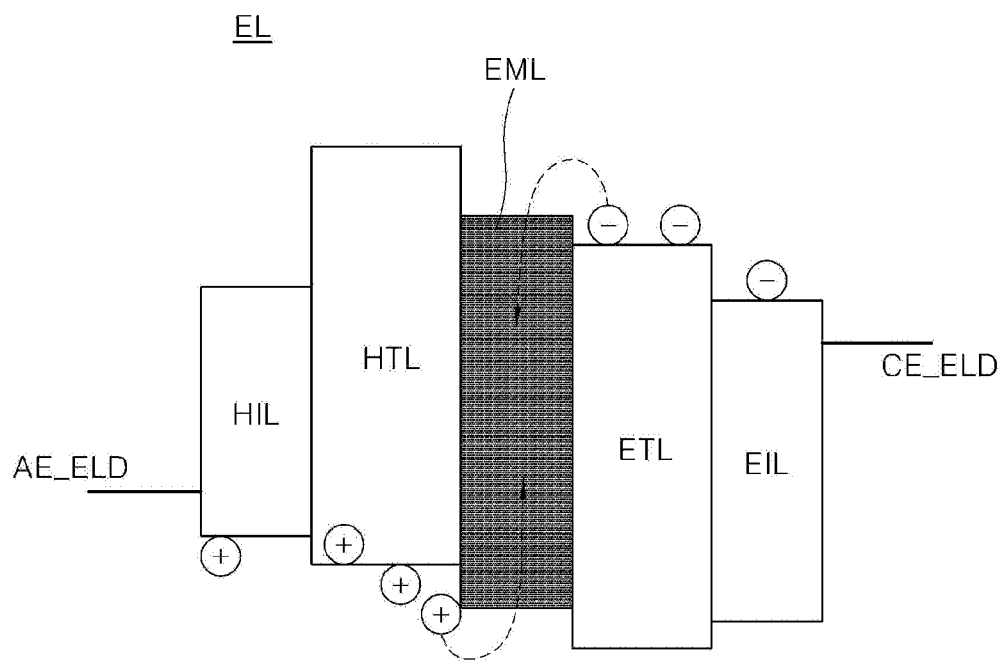
FIG. 12 is a view illustrating an example of an energy band diagram corresponding to the electro-luminescence device in FIG. 11.

As illustrated in FIG. 12, the electro-luminescence layer EL may have a structure in which a hole transport layer HTL, an emitting layer EML and an electron transport Layer ETL are stacked. Additionally, the electro-luminescence layer EL may have a single-stack light-emitting structure or a multi-stack light-emitting structure.

The hole transport layer HTL is disposed near the anode electrode AE_ELD, and the electron transport Layer ETL is disposed near the cathode electrode CE_ELD. Additionally, the electro-luminescence layer EL may further include a hole injection layer HIL which is disposed between the hole transport layer HTL and the anode electrode AE_ELD, or an electron injection layer EIL which is disposed between the electron transport layer ETL and the cathode electrode CE_ELD. However, the electro-luminescence layer EL is not limited what has been described.

The electro-luminescence layer EL includes a dopant of a color corresponding to each display pixel area DP. Accordingly, the electro-luminescence layer EL may emit light of a specific color. When the display panel 11 includes an additional color filter, the electro-luminescence layer EL may emit white light.

The cathode electrode CE_ELD corresponds to a plurality of display pixel areas DP which are adjacent to each other, and may be disposed to cover the bank BK and the electro-luminescence layer EL.

A light-receiving device PD includes an anode electrode AE_PD which is disposed above a buffer film 113 of a thin-film transistor array 110, a PIN junction layer PIN which is disposed above the anode electrode AE_PD, and a cathode electrode CE_PD which is disposed above the PIN junction layer PIN.

In the light-receiving device PD, the anode electrode AE_PD connects to a readout line ROL, and the cathode electrode CE_PD connects to bias power supply (Vbias in FIG. 3).

The readout line ROL may be disposed in the thin-film transistor array 110. That is, the readout line ROL together with the source electrode SE and the drain electrode DE may be disposed above the interlayer insulating film112 and may be covered with the buffer film 113. In this case, the anode electrode AE_PD of the light-receiving device PD may connect to the readout line ROL through a contact hole which penetrates the buffer film 113.

Though not additionally illustrated, the readout line ROL together with the anode electrode AE_PD may also be disposed above the buffer film 113.

Further, though not additionally illustrated, the readout line ROL may be disposed above an insulation film (invisible) between the interlayer insulating film112 and the buffer film 113.

Though not specifically illustrated, a connection line between the bias power supply Vbias and the cathode electrode CE_PD may be disposed in the same layer as any one of the cathode electrode CE_PD and the readout line ROL.

At least portion of the light-receiving device PD is covered with the bank BK.

Specifically, at least one display pixel area DP may be disposed between a plurality of light-receiving pixel areas RP, and each light-receiving pixel area RP is disposed between two adjacent display pixel areas DP. That is, each light-receiving device PD is disposed between two adjacent display pixel areas DP. Accordingly, the bank BK which covers the edge of the anode electrode AE_ELD of the electro-luminescence device ELD is disposed to cover the light-receiving device PD further.

A transparent film 121 is disposed above the cathode electrode CE_ELD of the electro-luminescence device ELD and covers the plurality of electro-luminescence devices ELD and the plurality of light-receiving devices PD. Additionally, the transparent film 121 may have a flat shape.

The transparent film 121 may consist of a transparent material to minimize loss of light which is emitted from the electro-luminescence device ELD to a transparent cover member 102 and to minimize loss of light which is input from the transparent cover member 102 to the light-receiving device PD. Additionally, the transparent film 121 may consist of a transparent insulation material to reduce electric interference between devices.

The transparent film 121 may be a material having a flattening property. Additionally, the transparent film 121 may include an encapsulation layer to prevent oxygen and/or moisture from infiltrating the plurality of electro-luminescence devices ELD. However, the present disclosure is not limited to what has been described.

A plurality of light shield patterns LS are disposed above the transparent film 121 and individually overlapped with the plurality of light-receiving devices PD which correspond to the plurality of light-receiving pixel areas RP.

Each light shield pattern LS has a width greater than that of each light-receiving device PD. That is, an edge of each light shield pattern LS protrudes wider than an edge of each light-receiving device PD in the shape of eaves.

The transparent cover member 102 is disposed above the plurality of light shield patterns LS. As an example, the transparent cover member 102 may be disposed above a protective film 122. That is, the protective film 122 may be disposed between the transparent cover member 102 and the plurality of light shield patterns LS. In this case, the plurality of light shield patterns LS is covered with the protective film 122. The protective film 122 may have a curved surface shape which corresponds to the curvature of a pattern of a lower end thereof, or may have a flat shape.

Next, another aspect of the present disclosure is described with reference to FIGS. 7 to 15.

Figure 7:
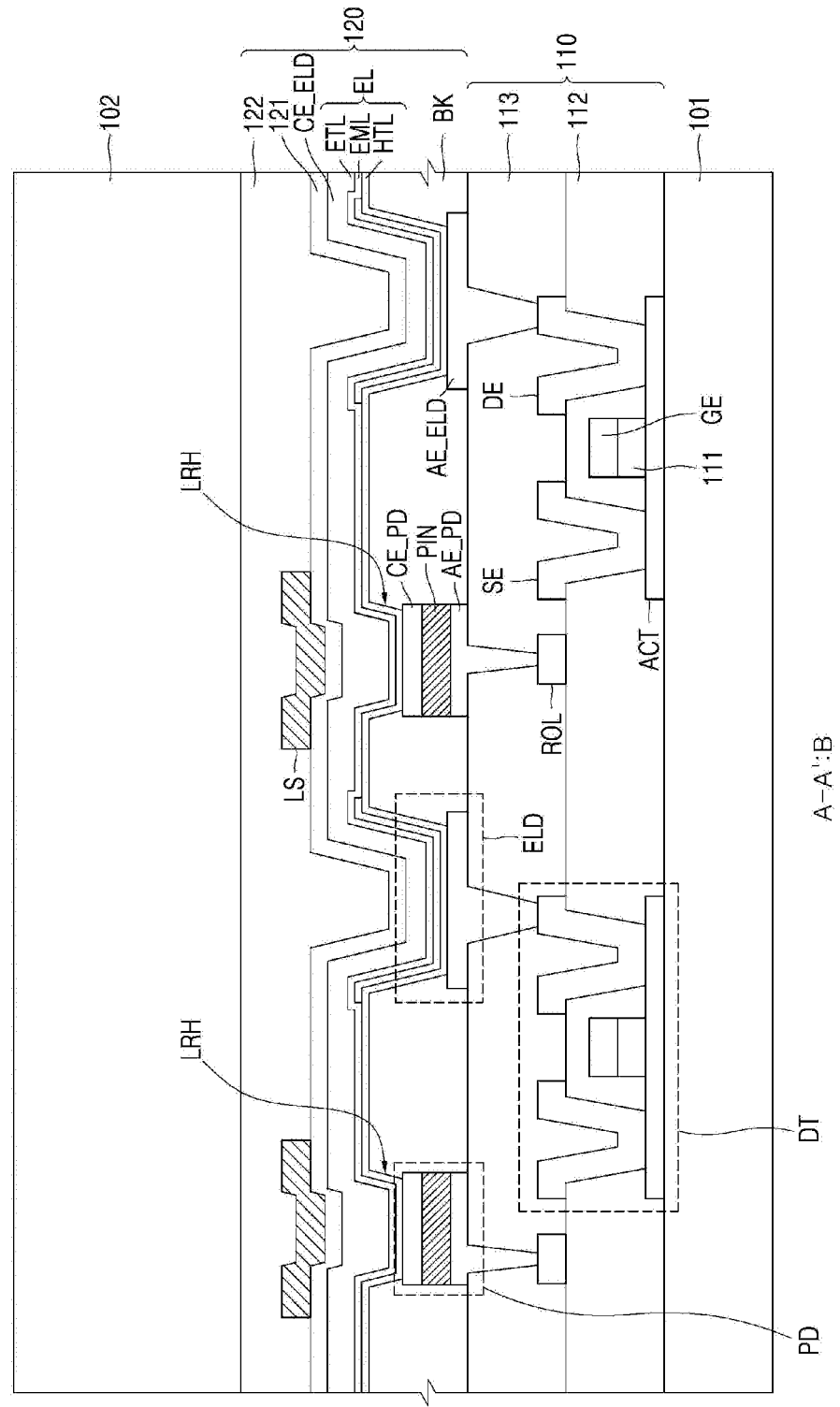
FIG. 7 is a view illustrating area B in FIG. 5 according to a second aspect of the present disclosure.

FIG. 7 is a view illustrating area B in FIG. 5 according to a second aspect of the present disclosure.

As illustrated in FIG. 7, a display panel 11*a* of a display apparatus according to the second aspect of the present disclosure is the same as that according to the first aspect of the present disclosure, illustrated in FIGS. 1 to 6, except that the display panel 11*a* further includes a light-receiving hole LRH which corresponds to each light-receiving device PD and which penetrates the bank BK. Accordingly, repetitive description is omitted.

The light-receiving hole LRH corresponds to at least portion of a light-receiving surface of each light-receiving device PD, onto which light is input, (an upper surface of the cathode electrode CE_PD of the light-receiving device in FIG. 7).

The light-receiving surface of the light-receiving device PD contacts the cathode electrode CE_ELD of the electro-luminescence device by the light-receiving hole LRH.

Accordingly, in a path in which light reflecting from an upper surface of the transparent cover member 102 is input to the light-receiving device PD, an interface between the cathode electrode CE_ELD and the bank BK may be removed. Thus, path loss of light which reflects from the upper surface of the transparent cover member 102 and which is input to the light-receiving device PD may be reduced.

According to the first aspect, the light-receiving device PD is covered with the bank BK, as illustrated in FIG. 6. Accordingly, the bank BK includes a transparent material to minimize loss of light which is input to the light-receiving device PD.

According to the second aspect, at least portion of the light-receiving surface of the light-receiving device PD is not covered with the bank BK but is exposed to the cathode electrode CE_ELD of the electro-luminescence device by the light-receiving hole LRH. Therefore, the bank BK is not required to consist of a transparent material, as illustrated in FIG. 7.

Figure 8:
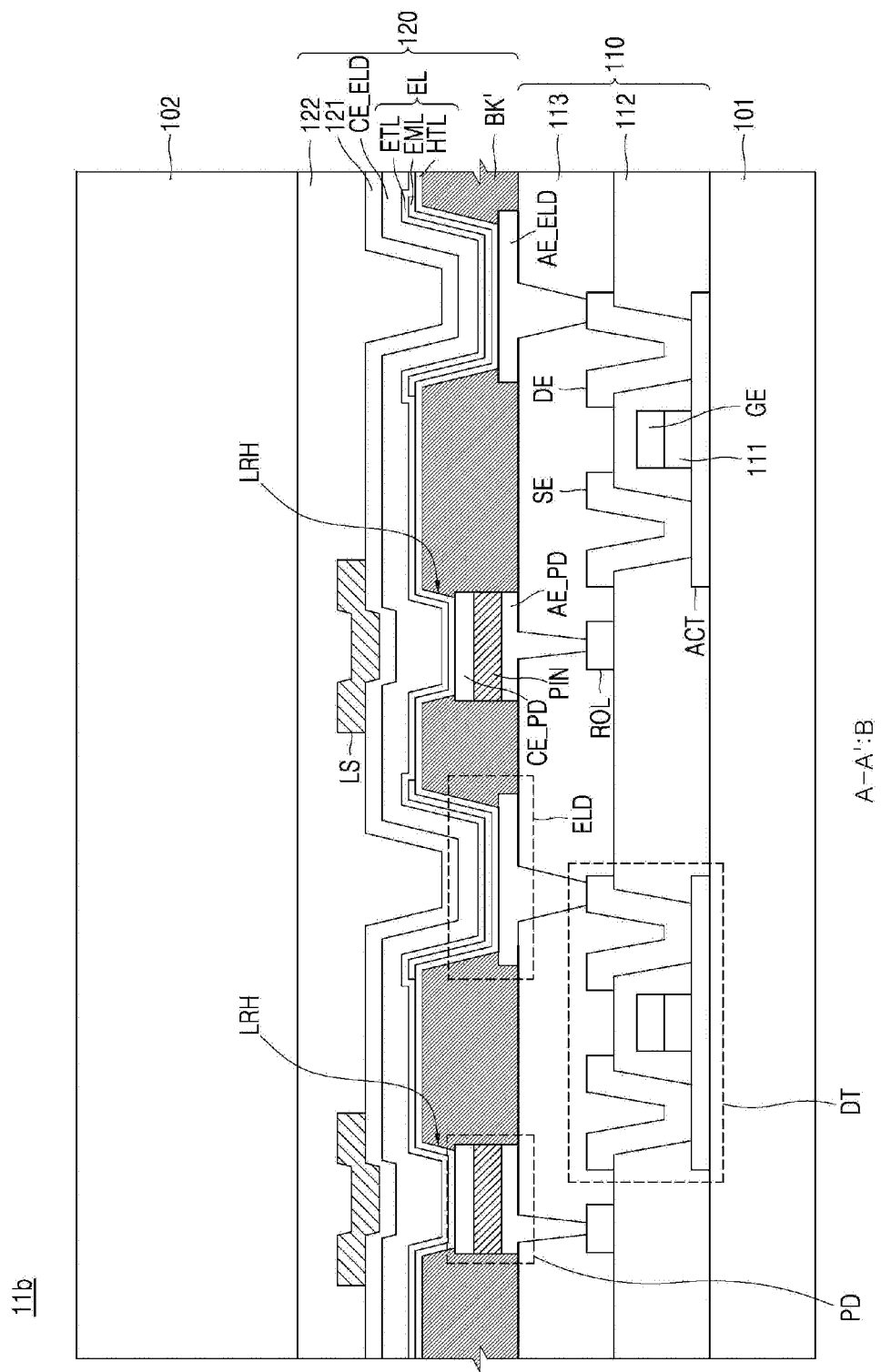
FIG. 8 is a view illustrating area B in FIG. 5 according to a third aspect of the present disclosure.

FIG. 8 is a view illustrating a rea B in FIG. 5 according to a third aspect of the present disclosure.

As illustrated in FIG. 8, a display panel 11*b* of a display apparatus according to the third aspect is the same as that according to the second aspect, illustrated in FIG. 7, except that the display panel 11*b* includes a bank BK' which includes an opaque material instead of a transparent material. Accordingly, repetitive description is omitted.

When the bank BK' includes an opaque material, i.e., a light-absorbing material, as in the third aspect, interference between light of adjacent electro-luminescence devices ELD may be reduced.

By the opaque bank BK', light emitted from the electro-luminescence device ELD adjacent to the light-receiving device PD may be prevented from being directly input the light-receiving device PD in a state in which the light does not reflect from the upper surface of the transparent cover member 102.

Accordingly, a reduction in a signal-to-noise ratio (SNR), which is caused by light of adjacent electro-luminescence devices ELD may be minimized. Thus, credibility of detection signals of the light-receiving device PD may improve further. Additionally, when necessary, a portion of the light-receiving device PD is covered with the opaque bank BK'. Accordingly, the size and shape of the light-receiving surface of the light-receiving device may be readily modified.

According to the first, second and third aspects, light Light_12 which reflects from the upper surface of the transparent cover member 102 is input to the light-receiving device PD by the light shield pattern LS.

Additionally, when the electro-luminescence layer EL and the cathode electrode CE_ELD are disposed in the entire display area, the electro-luminescence layer EL and the cathode electrode CE_ELD of the electro-luminescence device ELD are disposed above the light-receiving device PD. When the cathode electrode CE_ELD of the electro-luminescence device ELD includes a semi-transmitting metallic material, an amount of light which is reflected by the cathode electrode CE_ELD of the electro-luminescence device ELD, among light which is input to the light-receiving device PD, may increase.

Accordingly, a display apparatus according to a fourth aspect is provided which further includes a light receiving improvement pattern to suppress reflection of light from a plane of incidence of the light-receiving device PD.

Figure 9:
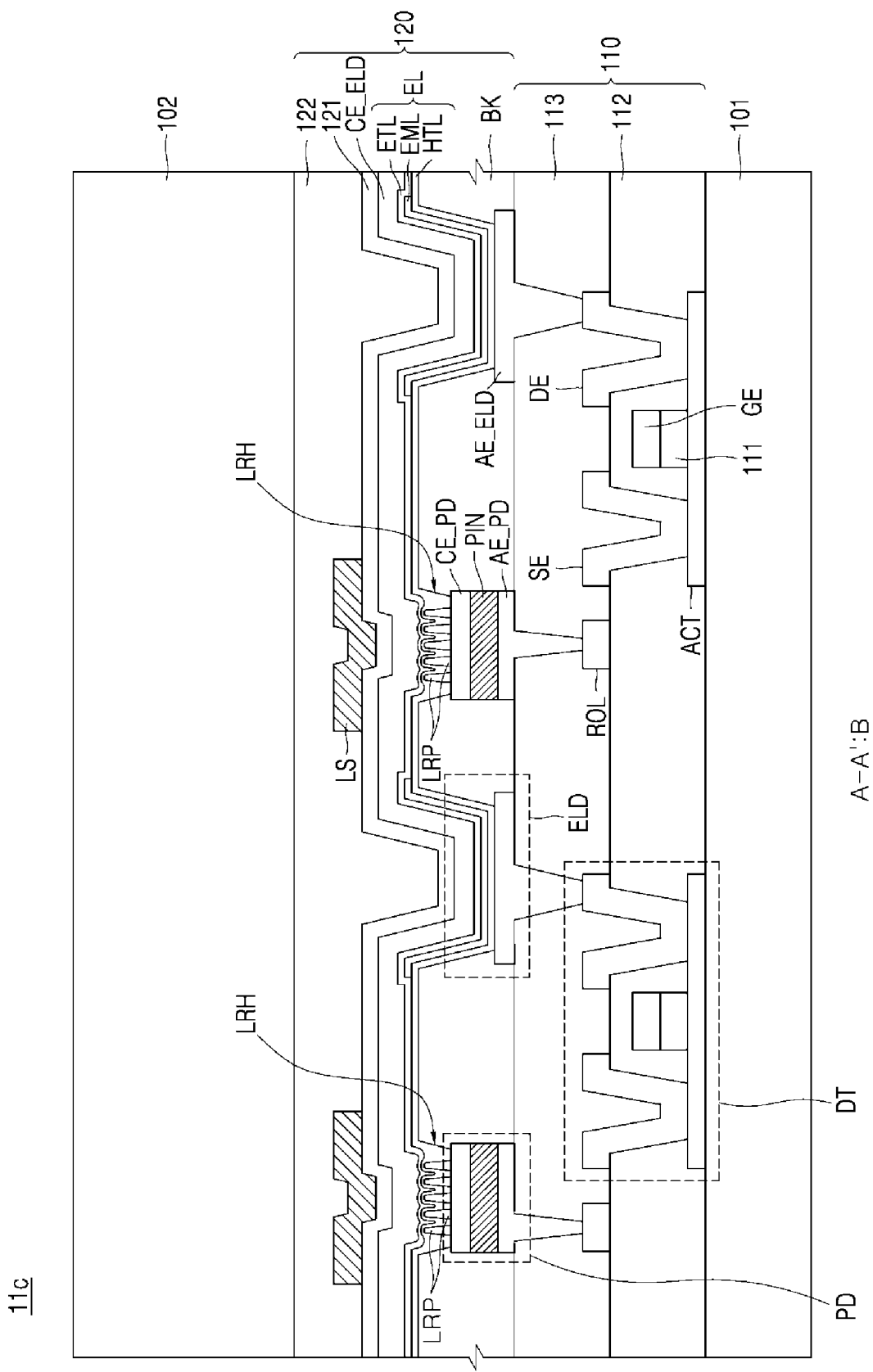
FIG. 9 is a view illustrating area B in FIG. 5 according to a fourth aspect of the present disclosure.

FIG. 9 is a view illustrating area B in FIG. 5 according to a fourth aspect of the present disclosure.

As illustrated in FIG. 9, a display panel 11c of a display apparatus according to the fourth aspect is the same as that according to the third aspect except that the display panel 11c further includes at least one light receiving improvement pattern (LRP; light-receiving pattern) which is disposed above a portion of the light-receiving device PD, which corresponds to a light-receiving hole LRH. Accordingly, repetitive description is omitted.

At least one light receiving improvement pattern LRP is disposed above at least portion of the cathode electrode CE_PD of the light-receiving device PD, which corresponds to the light-receiving hole LRH.

At least one light receiving improvement pattern LRP may be formed together with the light-receiving hole LRH during the process in which the bank BK is patterned to form the light-receiving PATENT hole LRH. In this case, at least one light receiving improvement pattern LRP includes the same material as the bank BK. However, this is only an example. The present disclosure is not limited to what has been described.

That is, at least one light receiving improvement pattern LRP may also be formed through a process of patterning an inorganic insulation material which is additionally deposited for easiness in patterning.

Each light receiving improvement pattern LRP may have a shape of a polyprism or a cylinder. However, the shape of the light receiving improvement pattern LRP is not limited. Additionally, one or more received-light improving patterns LRP are spaced apart from each other.

As described above, when one or more received-light improving patterns LRP are is included, light which is input to the light-receiving device PD may be scattered or diffusely reflected in a spaced area between one or more received-light improving patterns LRP.

The thickness of the cathode electrode CE _ELD may become smaller on a lateral surface of the light receiving improvement pattern LRP. Accordingly, a rate at which light is input to the light-receiving device PD may increase. Thus, a rate which the light-receiving device PD absorbs light may increase, and as a result, photoelectric conversion efficiency of the light-receiving device PD may be enhanced.

The at least one light receiving improvement pattern LRP may be formed together with the light-receiving hole LRH during a process of patterning the bank BK to form the light-receiving hole LRH. In this case, at least one light receiving improvement pattern LRP may consist of the same material as the bank BK, and an additional lamination process or an additional patterning process is not required for forming at least one light receiving improvement pattern LRP. Accordingly, even though at least one light receiving improvement pattern LRP is further provided, a manufacturing process does not become complicated.

According to the first, second, third and fourth aspects, the plurality of electro-luminescence devices ELD which correspond to the plurality of display pixel areas DP emit light of luminance corresponding to a predetermined image signal. The light-receiving device PD senses light which reflects from the upper surface of the transparent cover member 102.

An amount of light from at least one of the plurality of electro-luminescence devices ELD may be too small for the light-receiving device PD to sense the light. Additionally, most of the light from the electro-luminescence device ELD is required to reach an upper surface of the transparent cover member 102 at an incidence angle less than a critical angel corresponding to total internal reflection because the plurality of electro-luminescence devices ELD for displaying an image is required to emit light out of the transparent cover member 102.

Accordingly, a display apparatus according to a fifth aspect of the present disclosure is provided which further includes an additional light source for sensing a touch or for sensing a fingerprint in addition to the plurality of electro-luminescence devices ELD for displaying an image.

Figure 10:
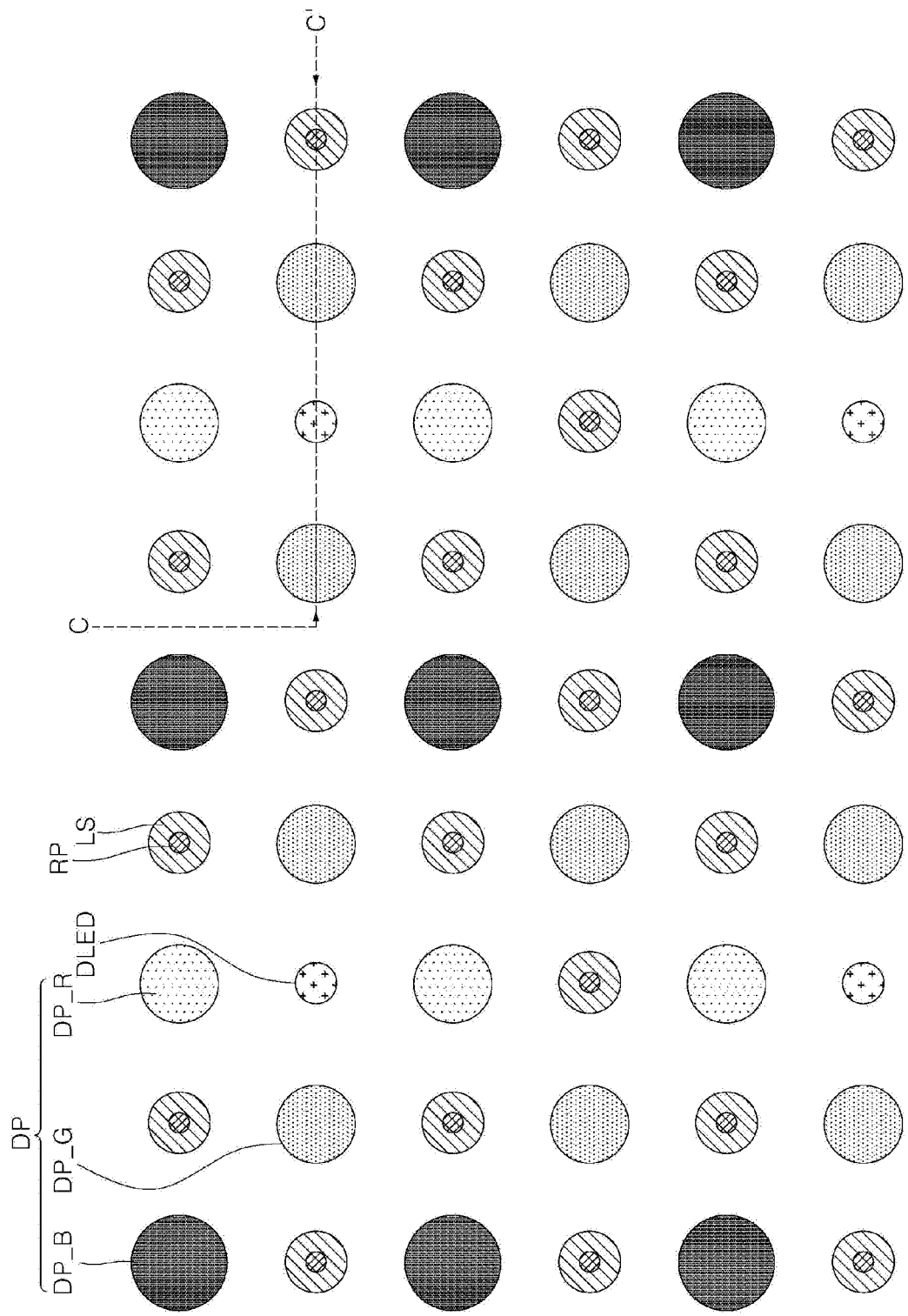
FIG. 10 is a view illustrating an example of a state in which a plurality of display pixel areas and a plurality of light-receiving pixel areas arranged in the display area in FIG. 1 according to a fifth aspect of the present disclosure.
Figure 11:
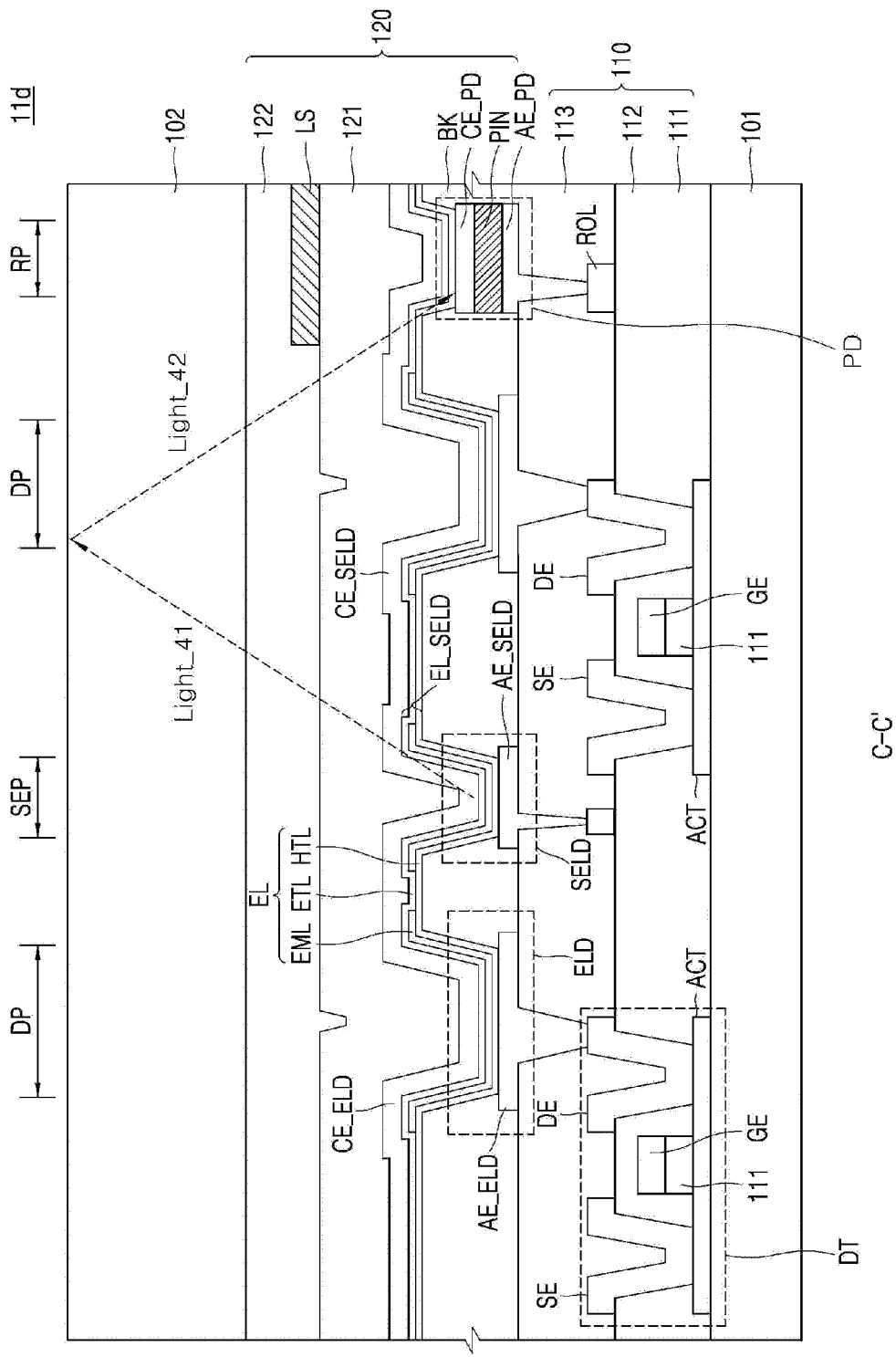
FIG. 11 is a view illustrating an example of a cross section of a display panel, which corresponds to area C-C' in FIG. 10.
Figure 13:
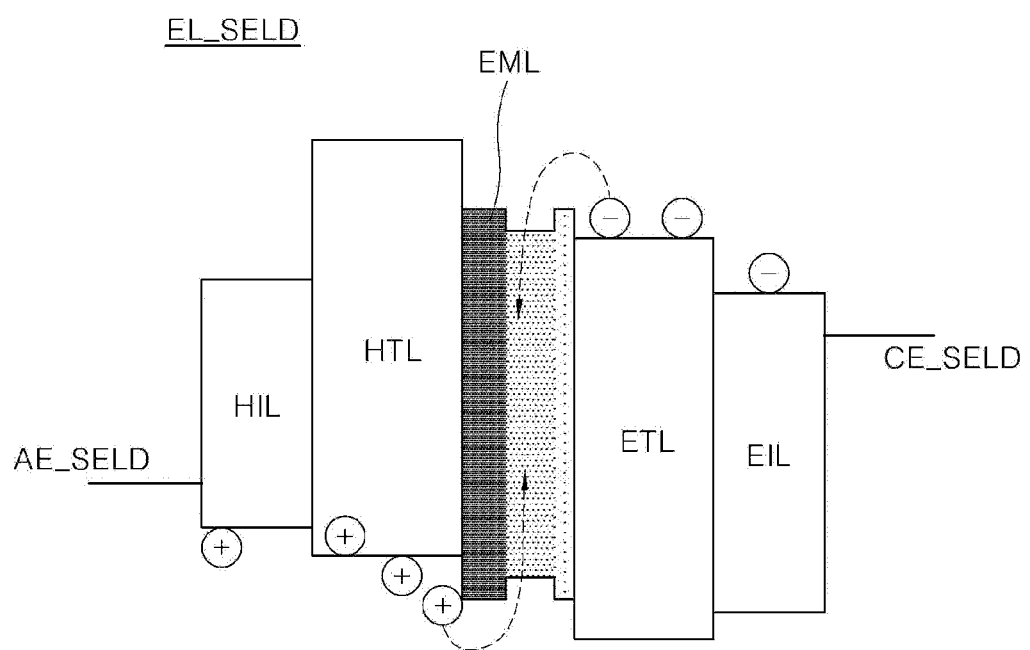
FIG. 13 is a view illustrating an example of an energy band diagram corresponding to the supplementary electro-luminescence device in FIG. 11.

FIG. 10 is a view illustrating an example of a state where a plurality of display pixel areas and a plurality of light-receiving pixel areas that are arranged in the display area in FIG. 1 according to a fifth aspect of the present disclosure, FIG. 11 is a view illustrating an example of a cross section of a display panel, which corresponds to area C-C' in FIG. 10, FIG. 12 is a view illustrating an example of an energy band diagram corresponding to the electro-luminescence device in FIG. 11, and FIG. 13 is a view illustrating an example of an energy band diagram corresponding to the supplementary electro-luminescence device in FIG. 11.

As illustrated in FIG. 10, a display apparatus according to the fifth aspect further includes at least one supplementary pixel area (SEP; supplementary emitting pixel) which is arranged in a matrix form together with a plurality of display pixel areas DP and a plurality of light-receiving pixel areas RP in a display area of a display panel 11.

Like the light-receiving pixel area RP, each supplementary pixel area SEP may be disposed between two adjacent display pixel areas DP.

Additionally, one or more supplementary pixel areas SEP may be disposed to alternate with one or more light-receiving pixel areas RP which are arranged in a sequence in any one direction among the plurality of light-receiving pixel areas RP.

As illustrated in FIG. 11, a display panel 11d of a display apparatus according to the fifth aspect is the same as that according to the first, second, third and fourth aspects except that the display panel 11d further includes at least one supplementary electro-luminescence device SELD which corresponds to at least one supplementary pixel area SEP. Accordingly, repetitive description is omitted.

At least one supplementary electro-luminescence device SELD is disposed in the same layer as a plurality of electro-luminescence devices ELD in an in-cell manner. That is, at least one supplementary electro-luminescence device SELD is disposed above a thin-film transistor array 110.

Specifically, each supplementary electro-luminescence device SELD includes a supplementary anode electrode AE_SELD which is disposed above a buffer film 113 of the thin-film transistor array 110, a supplementary electro-luminescence layer EL_SELD which is disposed above the supplementary anode electrode AE_SELD, and a supplementary cathode electrode CE_SELD which is disposed above the supplementary electro-luminescence layer EL_SELD.

A bank BK further covers an edge of the supplementary anode electrode AE_SELD together with an edge of an anode electrode AE_ELD of an electro-luminescence device.

The supplementary electro-luminescence layer EL_SELD may consist of an organic material like an electro-luminescence layer EL of the electro-luminescence device ELD. That is, like the electro-luminescence layer EL of the electro-luminescence device ELD, the supplementary electro-luminescence layer EL_SELD may have a structure in which a hole transport layer HTL, an emitting layer EML, and an electron transport layer ETL are stacked.

As illustrated in FIG. 12, the electro-luminescence layer EL of the electro-luminescence device ELD may have a structure in which a hole injection layer HIL, a hole transport layer HTL, an emitting layer EML, an electron transport layer ETL, and an electron injection layer EIL are stacked.

A hole which is injected from an anode electrode AE_ELD of an electro-luminescence device ELD into the hole injection layer HIL moves to the emitting layer EML through the hole transport layer HTL, and an electron which is injected from a cathode electrode CE_ELD of the electro-luminescence device ELD into the electron injection layer EIL moves to the emitting layer EML through the electron transport layer ETL. Accordingly, as the hole and the electron are moved to the emitting layer, the electron-hole pair is generated. As the electron-hole pair returns to a ground state, light is emitted.

The emitting layer EML may include a dopant or a host which corresponds to a color which is required to be emitted from each display pixel area DP. That is, an electro-luminescence layer of an electro-luminescence device corresponding to a red display pixel area DP_R may include a dopant or a host which corresponds to a red color, an electro-luminescence layer of an electro-luminescence device corresponding to a green display pixel area DP_G may include a dopant or a host which corresponds to a green color, and an electro-luminescence layer of an electro-luminescence device corresponding to a blue display pixel area DP_B may include a dopant or a host which corresponds to a blue color.

When a display panel includes an additional color filter, the electro-luminescence layer may include a dopant or a host which corresponds to at least two different colors and may emit white light.

The supplementary electro-luminescence layer EL_SELD of the supplementary electro-luminescence device SELD is formed through the same process as the process of forming the electro-luminescence layer EL of the electro-luminescence device ELD. Accordingly, the supplementary electro-luminescence layer EL_SELD of the supplementary electro-luminescence device SELD may have the same structure as the electro-luminescence layer EL of the electro-luminescence device ELD.

That is, the supplementary electro-luminescence layer EL_SELD of the supplementary electro-luminescence device SELD, as illustrated in FIG. 13, may have a structure in which a hole injection layer HIL, a hole transport layer HTL, an emitting layer EML, an electron transport layer ETL, and an electron injection layer EIL are stacked.

The supplementary electro-luminescence layer EL_SELD of the supplementary electro-luminescence device SELD may include a dopant or a host which corresponds to at least any one of red, green and blue. That is, the supplementary electro-luminescence layer EL_SELD may include a dopant or a host which corresponds to any one of red, green and blue. As an example, the supplementary electro-luminescence layer EL_SELD may include a dopant or a host of the same color as the electro-luminescence device ELD adjacent to the supplementary electro-luminescence device SELD.

The supplementary electro-luminescence layer EL_SELD may also include all dopants or all hosts which correspond to red, green and blue.

As described above, a display apparatus according to the fifth aspect further includes at least one supplementary electro-luminescence device SELD for increasing an amount of light which is input to a light-receiving device PD, in addition to a plurality of electro-luminescence devices ELD.

An amount of light which is input from a device array 120 to a transparent cover member 102 may be increased by the supplementary electro-luminescence device SELD. Additionally, when the supplementary electro-luminescence device optionally emits light to a predetermined area, an amount of light which reflects from an upper surface of the transparent cover member 102 may increase.

Accordingly, the amount of light which is input to the light-receiving device PD may be maintained at a certain level or above, regardless of luminance of the electro-luminescence device ELD. Therefore, credibility of generation of detection signals of each light-receiving device PD may improve.

Light of the supplementary electro-luminescence device SELD may be infrared rays (IR) such that light of the supplementary electro-luminescence device SELD is prevented from interfering with light for displaying an image.

The supplementary electro-luminescence device SELD is disposed in a limited area between adjacent electro-luminescence devices ELD. Additionally, it is difficult to dispose a device which emits infrared rays in an area with a narrow width.

Accordingly, a display apparatus according to a sixth aspect is provided which includes a supplementary electro-luminescence device SELD which may be disposed in a narrow area and which may emit infrared rays.

Figure 14:
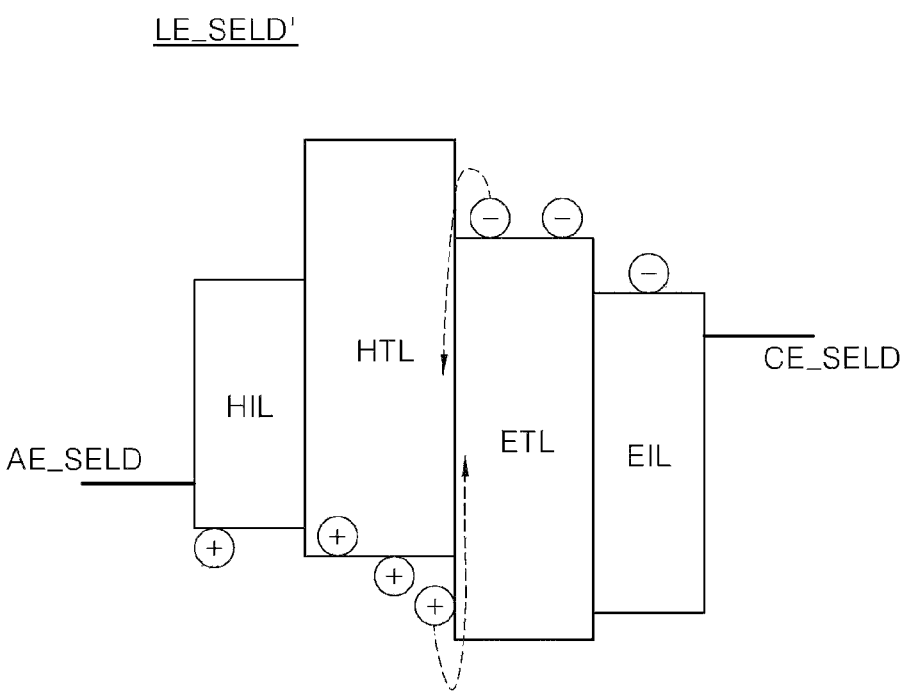
FIG. 14 is a view illustrating an example of an energy band diagram corresponding to the supplementary electro-luminescence device in FIG. 11 according to a sixth aspect of the present disclosure.

FIG. 14 is a view illustrating an example of an energy band diagram corresponding to a supplementary electro-luminescence device in FIG. 11 according to a sixth aspect of the present disclosure.

As illustrated in FIG. 14, a display apparatus according to the sixth aspect is the same as that according to the fifth aspect illustrated in FIGS. 10, 11, 12 and 13 except that a supplementary electro-luminescence layer EL_SELD of a supplementary electro-luminescence device SELD does not include an emitting layer EML unlike the electro-luminescence layer EL of the electro-luminescence device ELD. Accordingly, repetitive description is omitted.

The supplementary electro-luminescence layer EL_SELD' of the supplementary electro-luminescence device SELD according to the sixth aspect does not include an emitting layer EML. Accordingly, the supplementary electro-luminescence layer EL_SELD' of the supplementary electro-luminescence device SELD has a structure in which a hole transport layer HTL and an electron transport layer ETL are bonded.

When the emitting layer EML which corresponds to a certain color is removed, a change in energy levels may be less than a change in energy levels corresponding to visible light in the interface between the hole transport layer and the electron transport layer. Accordingly, the supplementary electro-luminescence device SELD which includes the supplementary electro-luminescence layer EL_SELD' with a structure in which an emitting layer EML is not included and in which a hole transport layer HTL and an electron transport layer ETL are bonded may emit infrared rays unlike the electro-luminescence device ELD which includes an emitting layer EML corresponding to visible light.

Thus, the supplementary electro-luminescence device SELD which is disposed in an area with a narrow width may be a device which may emit infrared rays.

As described above, the display apparatus according to each aspect includes a light shield pattern LS which is overlapped with a light-receiving device PD. Accordingly, the light-receiving device PD absorbs light which reflects from an upper surface of a transparent cover member 102.

However, the supplementary electro-luminescence device SELD according to the fifth and sixth aspects emits light in all directions. Accordingly, a portion of light which is emitted from the supplementary electro-luminescence device SELD is reflected on the upper surface of the transparent cover member 102, and the portion of light which is reflected as described above hardly increases in amount.

A display apparatus according to a seventh aspect is provided which may increase a portion of light which reflects on an upper surface of a transparent cover member 102 in amount, among light of a supplementary electro-luminescence device SELD.

Figure 15:
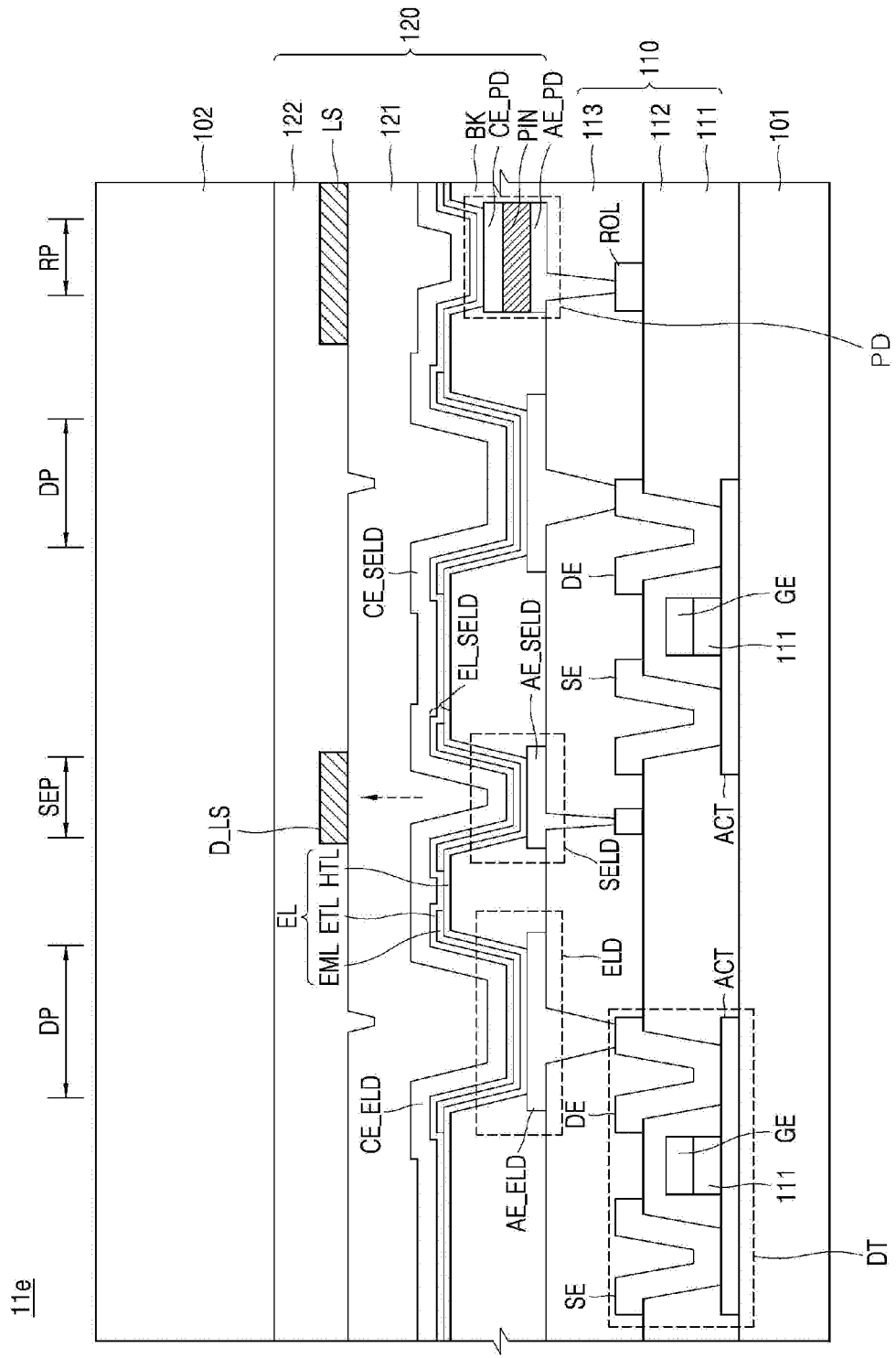
FIG. 15 is a view illustrating a cross section of a display panel, which corresponds to area C-C' in FIG. 10 according to a seventh aspect of the present disclosure.

FIG. 15 is a view illustrating a cross-section of a display panel, which corresponds to area C-C' in FIG. 10 according to a seventh aspect of the present disclosure.

As illustrated in FIG. 15, a display panel 11e of a display apparatus according to the seventh aspect is the same as that according to the fifth and the sixth aspects except that the display panel 11e further includes at least one supplementary light shield pattern S_LS which is disposed above a transparent film 121 and which is overlapped with at least one supplementary electro-luminescence device SELD. Accordingly, repetitive description is omitted.

At least one supplementary electro-luminescence device SELD is covered with a transparent film 121 like the plurality of electro-luminescence devices ELD and the plurality of light-receiving devices PD.

At least one supplementary light shield pattern S_LS is disposed above the transparent film 121, and is individually overlapped with at least one supplementary electro-luminescence device SELD.

Each supplementary light shield pattern S_LS has a width greater than that of each supplementary electro-luminescence device SELD which corresponds to each supplementary light shield pattern. When seen from above, an edge of each supplementary light shield pattern S_LS protrudes further than an edge of each supplementary electro-luminescence device SELD in all directions.

Among angles which are formed by lines which connect an edge of the supplementary electro-luminescence device SELD and an edge of the supplementary light shield pattern S_LS, and the normal line of the upper surface of the transparent cover member 102, a minimum angle may be set as a range of angles similar to a light-shield-pattern minimum available incidence angle θ_LS. By doing so, among light which is emitted from each supplementary electro-luminescence device SELD, an amount of noise light which may not be input to the light-receiving device PD may decrease.

As described above, when the supplementary light shield pattern S_LS is further provided, an amount of light which has an incidence angle greater than the light-shield-pattern minimum available incidence angle θ_LS among light of the supplementary electro-luminescence device SELD may optionally increase. Accordingly, an increase in noise light by the supplementary electro-luminescence device SELD may be prevented. As a result, a signal-to-noise ratio may improve.

The display apparatus 10 according to the eighth aspect further includes a supplementary light source unit which supplies light for sensing a touch or a fingerprint unlike the display apparatus according to the fifth aspect. The supplementary light source unit may be disposed on one surface of a substrate 101 of the display panel 11.

Figure 16:
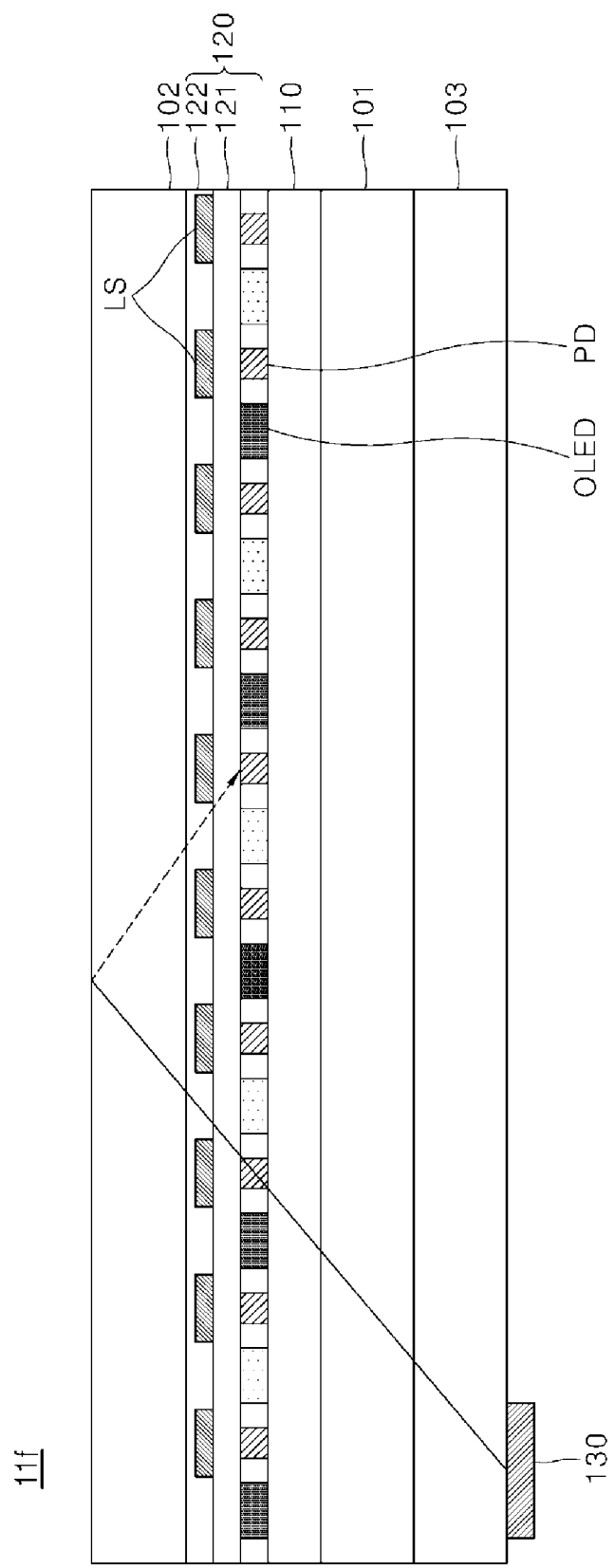
FIG. 16 is a view illustrating an example of a cross section of a display panel, which corresponds to area A-A' in FIG. 4 according to an eighth aspect of the present disclosure.

FIG. 16 is a view illustrating an example of a cross section of a display panel, which corresponds to area A-A' in FIG. 4 according to an eighth aspect of the present disclosure.

As illustrated in FIG. 16, a display panel 11f according to the eight aspect is the same as that according to the first, second, third, fourth and fifth aspects except that the display panel 11f further includes a supplementary substrate 103 which is disposed below a substrate 101 and which has the shape of a flat plate, and a supplementary light source unit 130 which is disposed on one side of a supplementary substrate 103. Accordingly, repetitive description is omitted below.

The supplementary light source unit 130 includes at least one luminescence device (invisible) The supplementary light source unit 130 supplies light during a sensing period for which a plurality of light-receiving devices PD are driven. The supplementary light source unit 130 is disposed in a different layer from a device array 120 which includes a plurality of electro-luminescence devices ELD. Accordingly, the supplementary light source unit 130 may readily supply light which has an emission direction and a range of wavelengths different from those of the electro-luminescence device ELD.

Further, at least one luminescence device which is included in the supplementary light source unit 130 may be separately driven for each area.

The supplementary substrate 103 may include a driving circuit which supplies driving current to at least one luminescence device provided in the supplementary light source unit 130.

The present disclosure is not limited to the above-described aspects and attached drawings. It will be apparent to one having ordinary skill in the art to which the present disclosure pertains that various redisposements, modifications and changes may be made without departing from the technical spirit of the disclosure

What is claimed is:

1. A display apparatus including a plurality of display pixel areas and a plurality of light-receiving pixel areas which are arranged in a display area in which an image is displayed, comprising:
   a thin-film transistor array including a plurality of thin-film transistors which correspond to the plurality of display pixel areas;
   a plurality of electro-luminescence devices disposed above the thin-film transistor array and corresponding to the plurality of display pixel areas;
   a plurality of light-receiving devices disposed above the thin-film transistor array and corresponding to the plurality of light-receiving pixel areas;
   a transparent film covering the plurality of electro-luminescence devices and the plurality of light-receiving devices; and
   a plurality of light shield patterns disposed on the transparent film and overlapping the plurality of light-receiving devices.

2. The display apparatus of claim 1, wherein each light shield pattern has a width greater than that of each light-receiving device and has an edge protrudes further than that of each light-receiving device.

3. The display apparatus of claim 2, further comprising a transparent cover member covering the plurality of light shield patterns.

4. The display apparatus of claim 3, wherein among angles between lines which connect the edge of each light shield pattern and the edge of each light-receiving device and a normal line of an upper surface of the transparent cover member, a minimum angle (a light-shield-pattern minimum available incidence angle) is greater than a predetermined critical angle, and
wherein the predetermined critical angle corresponds to the transparent cover member and a medium which contacts the upper surface of the transparent cover member.

5. The display apparatus of claim 3, each electro-luminescence device comprises:
a first electrode disposed above the thin-film transistor array;
an electro-luminescence layer disposed above the first electrode; and
a second electrode disposed above the electro-luminescence layer,
wherein an edge of the first electrode is covered by a bank disposed above the thin-film transistor array.

6. The display apparatus of claim 5, wherein the plurality of light-receiving pixel areas are disposed to alternate with one or more display pixel areas which are arranged in a sequence among the plurality of display pixel areas, and
wherein the bank further covers at least portion of each light-receiving device.

7. The display apparatus of claim 6, wherein the bank has a light-receiving hole corresponding to at least portion of each of the light-receiving devices.

8. The display apparatus of claim 7, further comprising at least one light receiving improvement pattern disposed above each light-receiving device, which corresponds to the light-receiving hole.

9. The display apparatus of claim 8, wherein the at least one light receiving improvement pattern includes a same material as the bank.

10. The display apparatus of claim 5, wherein the bank includes a light-absorbing insulation material or an opaque material.

11. The display apparatus of claim 5, wherein the bank includes a light-transmitting insulation material.

12. The display apparatus of claim 5, further comprising at least one supplementary electro-luminescence device corresponding to at least one supplementary pixel area which is arranged together with the plurality of display pixel areas and the plurality of light-receiving pixel areas in the display area,
wherein the at least one supplementary electro-luminescence device comprises:
a first supplementary electrode disposed above the thin-film transistor array;
a supplementary electro-luminescence layer disposed above the first supplementary electrode; and
a second supplementary electrode disposed above the supplementary electro-luminescence layer, and
wherein the bank covers an edge of the first supplementary electrode, and the transparent film covers the at least one supplementary electro-luminescence device.

13. The display apparatus of claim 12, wherein the supplementary electro-luminescence layer has a structure in which a hole transport layer, an emitting layer, and an electron transport layer are sequentially stacked.

14. The display apparatus of claim 13, wherein the supplementary electro-luminescence layer has a structure in which a hole transport layer and an electron transport layer are bonded with each other except for the emitting layer.

15. The display apparatus of claim 12, further comprising at least one supplementary light shield pattern disposed above the transparent film and overlapping the at least one supplementary electro-luminescence device.

16. The display apparatus of claim 15, wherein the at least one supplementary light shield pattern has a width greater than that of each supplementary electro-luminescence device and has an edge of each supplementary light shield pattern protrudes further than an edge of each supplementary electro-luminescence device.

17. The display apparatus of claim 1, wherein each light-receiving device comprises:
a first electrode disposed above the thin-film transistor array;
a PIN junction layer disposed above the first electrode; and
a second electrode disposed above the PIN junction layer.

18. The display apparatus of claim 3, further comprising a protective film having a flat shape or having a curved surface shape which corresponds to a curvature of a lower end of the protective film.

19. The display apparatus of claim 2, wherein an edge of each light shield pattern protrudes further than an edge of each light-receiving device in all directions.

20. The display apparatus of claim 1, further comprising a supplementary light source unit which is disposed in a different layer from the plurality of electro-luminescence devices and the plurality of light-receiving devices.

* * * * *